(12) United States Patent
Honda et al.

(10) Patent No.: US 11,569,225 B2
(45) Date of Patent: Jan. 31, 2023

(54) SEMICONDUCTOR DEVICE

(71) Applicant: Mitsubishi Electric Corporation, Tokyo (JP)

(72) Inventors: Shigeto Honda, Tokyo (JP); Takahiro Nakatani, Tokyo (JP); Tetsuya Nitta, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 137 days.

(21) Appl. No.: 17/198,170

(22) Filed: Mar. 10, 2021

(65) Prior Publication Data
US 2021/0384189 A1 Dec. 9, 2021

(30) Foreign Application Priority Data
Jun. 3, 2020 (JP) .............................. JP2020-096675

(51) Int. Cl.
*H01L 27/06* (2006.01)
*H01L 29/47* (2006.01)
*H01L 29/739* (2006.01)

(52) U.S. Cl.
CPC ...... *H01L 27/0635* (2013.01); *H01L 27/0652* (2013.01); *H01L 29/47* (2013.01); *H01L 29/7397* (2013.01)

(58) Field of Classification Search
CPC . H01L 27/0635; H01L 27/0652; H01L 29/45; H01L 29/47; H01L 29/7397
See application file for complete search history.

(56) References Cited

U.S. PATENT DOCUMENTS 9,472,548 B2 10/2016 Soneda
2015/0021657 A1* 1/2015 Ogura ................. H01L 29/1095
257/139

FOREIGN PATENT DOCUMENTS

JP 6319057 B2 5/2018

* cited by examiner

*Primary Examiner* — Matthew C Landau
*Assistant Examiner* — Mark Hatzilambrou
(74) *Attorney, Agent, or Firm* — Studebaker & Brackett PC

(57) ABSTRACT

A semiconductor device in which a transistor and a diode are formed on a common semiconductor substrate is provided. The semiconductor substrate includes a transistor region in which a transistor is formed and a diode region in which a diode is formed. At least one first electrode on a second main surface side of the transistor region and at least one second electrode on a second main surface side of the diode region are made of different materials.

13 Claims, 23 Drawing Sheets

F I G. 1
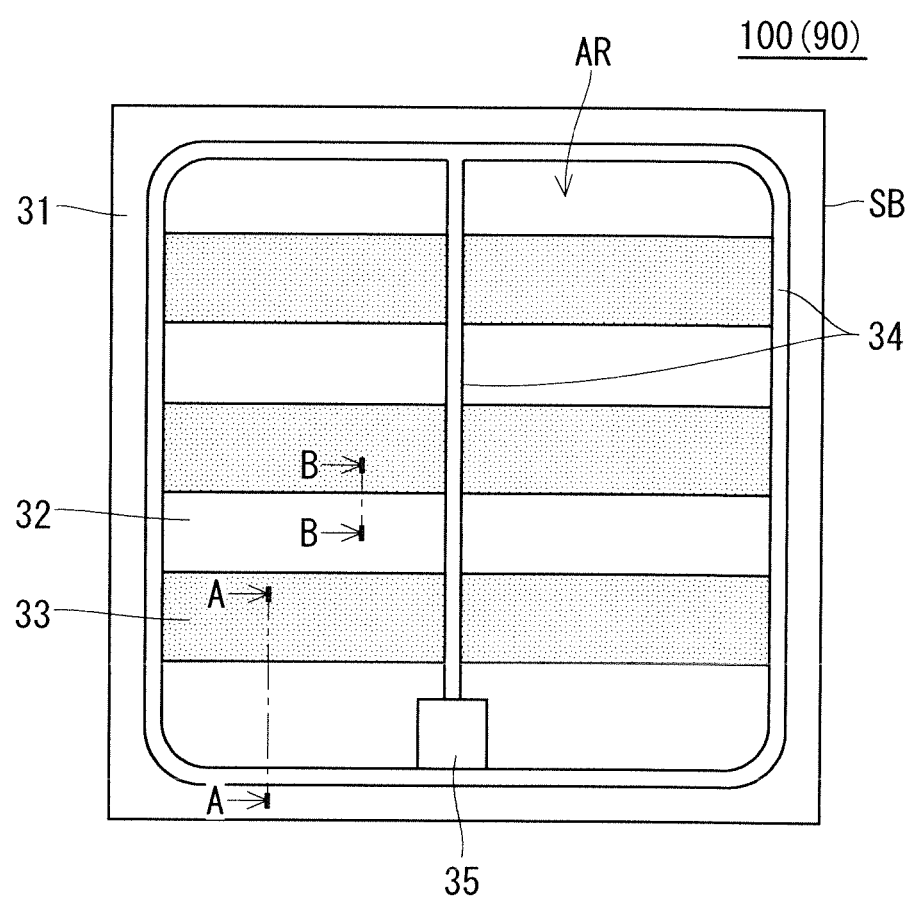

SEMICONDUCTOR DEVICE

BACKGROUND OF THE INVENTION

Field of the Invention

The present disclosure relates to a semiconductor device, and particularly, to a reverse conduction type semiconductor device.

Description of the Background Art

Japanese Patent No. 6319057 discloses a reverse conduction semiconductor device (Reverse Conducting Insulated Gate Bipolar Transistor: RC-IGBT). A reverse conduction semiconductor device is a semiconductor device in which an insulated gate bipolar transistor (IGBT) and a commutation diode (Free Wheeling Diode: FWD) are formed on a common semiconductor substrate. In the reverse conduction semiconductor device disclosed in Japanese Patent No. 6319057, a p-type collector layer as an IGBT collector and an n-type cathode layer as an FWD cathode layer are formed on the back surface side of a semiconductor substrate, and a back electrode of the semiconductor substrate has a laminated structure of AlSi—Ti—Ni—Au or Ti—Ni—Au.

The type of an electrode has a great influence on the metal contact property. For example, when the back electrode is AlSi, a good metal contact property with low contact resistance can be obtained with the P-type semiconductor layer, but contact resistance is high and the metal contact property is low with the n-type semiconductor layer. On the other hand, when the back electrode is Ti, a good metal contact property can be obtained with the n-type semiconductor layer, but the metal contact property is low with the p-type semiconductor layer.

In Japanese Patent No. 6319057, when a portion of the back electrode in contact with the semiconductor substrate is AlSi, the metal contact property with the n-type semiconductor layer may be low, and when a portion of the back electrode in contact with the semiconductor substrate is Ti, the metal contact property with the p-type semiconductor layer may be low, and in an RC-IGBT having an n-type semiconductor layer and a p-type semiconductor layer on the back surface side of the semiconductor substrate, the degree of freedom in designing the back surface side of the semiconductor substrate may be low.

SUMMARY

A semiconductor device having a high degree of freedom in designing the back surface side of a semiconductor substrate is provided.

A semiconductor device according to the present disclosure is a semiconductor device in which a transistor and a diode are formed on a common semiconductor substrate. The semiconductor substrate includes a transistor region in which the transistor is formed, and a diode region in which the diode is formed. The transistor region includes a first semiconductor layer of a first conductive type provided on a second main surface side of the semiconductor substrate; a second semiconductor layer of a second conductive type provided on the first semiconductor layer; a third semiconductor layer of the first conductive type provided on a first main surface side of the semiconductor substrate with respect to the second semiconductor layer; a fourth semiconductor layer of the second conductive type provided on the third semiconductor layer; a gate insulating film formed in contact with the fourth semiconductor layer, the third semiconductor layer, and the second semiconductor layer; a gate electrode formed so as to face the third semiconductor layer via the gate insulating film; an electrode connected to the fourth semiconductor layer; and at least one first electrode connected to the first semiconductor layer. The diode region includes a fifth semiconductor layer of the second conductive type provided on the second main surface side of the semiconductor substrate; the second semiconductor layer provided on the fifth semiconductor layer; the third semiconductor layer; a sixth semiconductor layer of the first conductive type provided on the third semiconductor layer; the electrode connected to the sixth semiconductor layer; and at least one second electrode connected to the fifth semiconductor layer. The at least one first electrode and the at least one second electrode are made of different materials.

According to the semiconductor device, the at least one first electrode on the at least one second main surface side of the transistor region and the second electrode on the second main surface side of the diode region are made of different materials. Therefore, the degree of freedom in designing the back surface side of the semiconductor substrate can be increased.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view showing a configuration of an RC-IGBT;

DESCRIPTION OF THE PREFERRED EMBODIMENTS

Introduction

Figure 2:
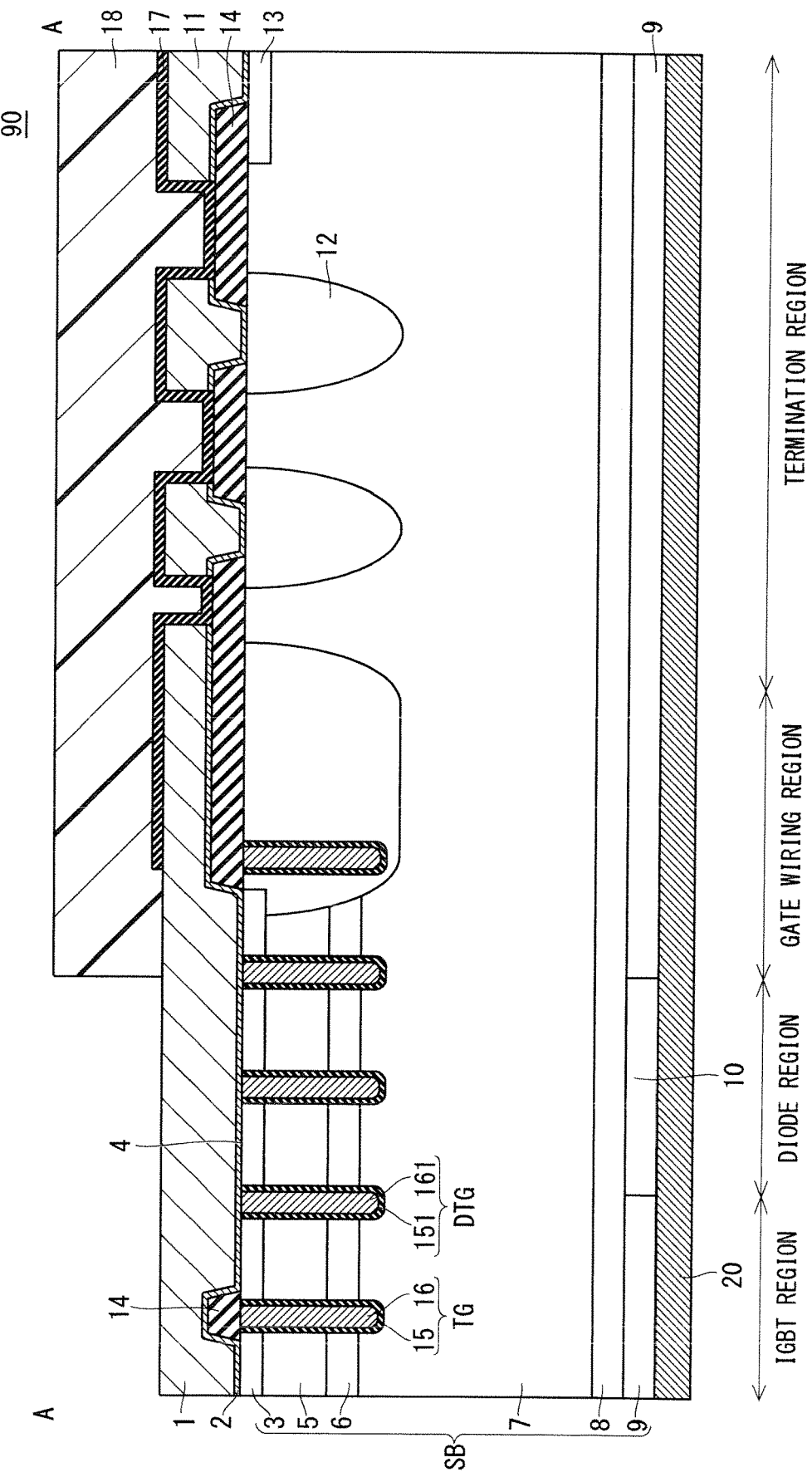
FIG. 2 is a cross-sectional view showing an example of a configuration of an RC-IGBT.

Prior to the description of the embodiment, description will be given on a phenomenon caused by the low degree of freedom in designing the back surface side of a semiconductor substrate of an RC-IGBT. In the following description, regarding the conductive type of impurities, p-type is referred to as a "first conductive type", and n-type, which is the opposite conductive type to the p-type, is referred to as a "second conductive type", but the opposite definition may also be used. In addition, the magnitude of impurity concentration is expressed as n-type, $n^+$-type, $n^-$-type, p-type, $p^+$-type, and $p^-$-type. This means that in comparison with n-type, $n^+$-type has higher impurity concentration than n-type and $n^-$-type has lower impurity concentration than n-type, and in comparison with p-type, $p^+$-type has higher impurity concentration than p-type, and $p^-$-type has lower impurity concentration than p-type.

In addition, the drawings are schematically shown, and the interrelationships between the sizes and positions of the images shown in the different drawings are not necessarily exactly described and may be changed as appropriate. Further, in the following description, similar components are illustrated with the same reference numerals, and their names and functions are also the same. Therefore, detailed description of them may be omitted.

Also, in the following description, terms that mean specific positions and directions such as "upper", "lower", "side", "front", and "back" may be used. They are used for convenience to facilitate understanding of the contents of the embodiment, and have nothing to do with the direction in which it is actually implemented. Further, in the following, "outside" is a direction toward the outer periphery of the semiconductor device, and "inside" is a direction opposite to the "outside".

FIG. 1 is an example of a plan view of a Reverse Conducting IGBT (RC-IGBT). In the planar structure shown in FIG. 1, an IGBT region 33 (transistor region) and a diode region 32 (diode region) are provided side by side in a stripe shape, and can be simply called a "striped type". The plane configuration is the same as that in FIG. 1 in all the embodiments described later.

As shown in FIG. 1, the RC-IGBT is provided on a semiconductor substrate SB having a quadrangular shape in a plan view, and a gate wiring region 34 is provided along the outer periphery of an active region AR in the central portion of the semiconductor substrate SB. The region outside the gate wiring region 34 on the outer periphery of the active region AR is a termination region 31.

In the active region AR, a gate pad region 35 in contact with the gate wiring region 34 on the outer periphery and the gate wiring region 34 extending from the gate pad region 35 and crossing the active region AR in a plan view are provided. The extending direction of the gate wiring region 34 in the active region AR is the arrangement direction of the striped IGBT region 33 and the diode region 32. One end of the extending direction of the gate wiring region 34 is connected to the gate pad region 35, and the other end is connected to the gate wiring region 34 on the outer periphery.

FIG. 2 shows a cross section in a direction indicated by the arrow along line A-A shown in FIG. 1, as a cross sectional view of an RC-IGBT 90. As shown in FIG. 2, the RC-IGBT 90 has, for example, an $n^-$-type drift layer 7 (second semiconductor layer) composed of a semiconductor substrate SB such as a silicon substrate. In FIG. 2, the semiconductor substrate SB ranges from an $n^+$-type source layer 3 (fourth semiconductor layer) and a $p^+$-type contact layer 4 (sixth semiconductor layer) to a $p^+$-type collector layer 9 (first semiconductor layer) and an $n^+$-type cathode layer 10 (fifth semiconductor layer). In FIG. 2, the upper end on the sheet of the $n^+$-type source layer 3 and the $p^+$-type contact layer 4 is referred to as a first main surface of the semiconductor substrate SB, and the lower end on the sheet of the $p^+$-type collector layer 9 and the $n^+$-type cathode layer 10 is referred to as a second main surface of the semiconductor substrate SB. The first main surface of the semiconductor substrate SB is a main surface on the front surface side of the RC-IGBT 90, and the second main surface of the semiconductor substrate SB is a main surface on the back surface side of the RC-IGBT 90.

As shown in FIG. 2, in the IGBT region and the diode region, the n-type carrier stored layer 6, having a higher concentration of n-type impurities than that of the $n^-$-type drift layer 7, is provided on the first main surface side of the $n^-$-type drift layer 7. By providing the n-type carrier stored layer 6, it is possible to reduce the energization loss when a current flows in the IGBT region. The n-type carrier stored layer 6 and the $n^-$-type drift layer 7 may be collectively referred to as a drift layer.

A p-type base layer 5 (third semiconductor layer) is provided on the first main surface side of the n-type carrier stored layer 6. The p-type base layer 5 is in contact with a gate trench insulating film 15 of the trench gate TG. An $n^+$-type source layer 3 is provided in contact with the gate trench insulating film 15 of the trench gate TG on the first main surface side of the p-type base layer 5. Further, in the diode region, the $p^+$-type contact layer 4 is provided in contact with a dummy trench insulating film 151 of a dummy trench gate DTG in place of the $n^+$-type source layer 3.

The $n^+$-type source layer 3 and the $p^+$-type contact layer 4 form the first main surface of the semiconductor substrate SB. The $p^+$-type contact layer 4 is a region in which the concentration of p-type impurities is higher than that of the p-type base layer 5, and when it is necessary to distinguish between the $p^+$-type contact layer 4 and the p-type base layer 5, each of them may be called separately. The $p^+$-type contact layer 4 and the p-type base layer 5 may be collectively called a p-type base layer.

Further, as shown in FIG. 2, in the gate wiring region and the termination region, a p-type terminal well layer 12 is provided in the upper layer portion on the first main surface side of the $n^-$-type drift layer 7. The p-type terminal well layer 12 is provided so as to surround the active region including the IGBT region and the diode region. In the p-type terminal well layer 12, a plurality of rings are concentrically provided, and the number of p-type terminal well layers 12 to be arranged is appropriately selected according to the withstand voltage design of the RC-IGBT 90. On the further outer peripheral side of the p-type terminal well layer 12, an $n^+$-type channel stopper layer 13 is provided, and the $n^+$-type channel stopper layer 13 surrounds the p-type terminal well layer 12.

Further, in the IGBT region, the diode region, the gate wiring region, and the termination region, an n-type buffer layer 8 (second semiconductor layer) in which the concentration of n-type impurities is higher than that of the $n^-$-type drift layer 7 is provided on the second main surface side of the $n^-$-type drift layer 7. The n-type buffer layer 8 is provided to prevent the depletion layer extending from the p-type base layer 5 to the second main surface side from punching through when the RC-IGBT 90 is in the off state. The n-type buffer layer 8 and the $n^-$-type drift layer 7 may be collectively referred to as a drift layer.

Further, in the IGBT region, the gate wiring region, and the termination region, the $p^+$-type collector layer 9 is provided between the n⁻-type drift layer 7 and the second main surface of the semiconductor substrate SB.

In the diode region, the n⁺-type cathode layer 10 is provided between the n⁻-type drift layer 7 and the second main surface of the semiconductor substrate SB.

Next, the trench gate TG and the dummy trench gate DTG will be described. As shown in FIG. 2, a plurality of trenches are formed from the first main surface of the semiconductor substrate SB, penetrating the p-type base layer 5 and reaching the n⁻-type drift layer 7. The trench gate TG is formed by providing a gate trench electrode 16 (gate electrode) in the trench via a gate trench insulating film 15 (gate insulating film). The gate trench electrode 16 faces the n⁻-type drift layer 7 via the gate trench insulating film 15. Further, the dummy trench gate DTG is formed by providing a dummy trench electrode 161 in the trench via a dummy trench insulating film 151.

The dummy trench electrode 161 faces the n⁻-type drift layer 7 via the dummy trench insulating film 151. The gate trench insulating film 15 of the trench gate TG is in contact with the p-type base layer 5 and the n⁺-type source layer 3. When a gate drive voltage is applied to the gate trench electrode 16, a channel is formed in the p-type base layer 5 in contact with the gate trench insulating film 15 of the trench gate TG.

As shown in FIG. 2, an interlayer insulating film 14 is provided on the gate trench electrode 16 of the trench gate TG. A barrier metal 2 is formed on a region where the interlayer insulating film 14 is not provided on the first main surface of the semiconductor substrate SB and on the interlayer insulating film 14. The barrier metal 2 may be, for example, a conductor containing titanium (Ti), that is, for example, titanium nitride or TiSi in which titanium and silicon (Si) are alloyed.

As shown in FIG. 2, the barrier metal 2 is in ohmic contact with the n⁺-type source layer 3, the p⁺-type contact layer 4, and the dummy trench electrode 161, and is electrically connected with the n⁺-type source layer 3, the p⁺-type contact layer 4, and the dummy trench electrode 161. On the barrier metal 2, a surface electrode 1 (electrode) is provided. The surface electrode 1 may be made of, for example, an aluminum alloy such as an aluminum silicon alloy (AlSi), or may be an electrode composed of a multi-layered metal film having a plating film formed by electroless plating or electrolytic plating on the electrode made of aluminum alloy. The plating film formed by electroless plating or electrolytic plating may be, for example, a nickel (Ni) plating film. Further, when there is a fine region such as between adjacent interlayer insulating films 14 where good embedding cannot be obtained with the surface electrode 1, tungsten having better embedding property than that of the surface electrode 1 may be provided in the fine region and the surface electrode 1 may be provided on the tungsten. The surface electrode 1 may be provided on the n⁺-type source layer 3, the p⁺-type contact layer 4, and the dummy trench gate DTG, without providing the barrier metal 2. Further, the barrier metal 2 may be provided only on the n-type semiconductor layer such as the n⁺-type source layer 3. The barrier metal 2 and the surface electrode 1 may be collectively called an emitter electrode.

A back electrode 20 (first back electrode) is provided on the second main surface of the semiconductor substrate SB. The back electrode 20 is continuously and integrally formed from the IGBT region and the diode region up to the termination region. On the other hand, on the first main surface of the semiconductor substrate SB in the termination region, the surface electrode 1 continuing from the IGBT region and the diode region and a terminal electrode 11 separated from the surface electrode 1 are provided.

The surface electrode 1 and the terminal electrode 11 are electrically connected to each other via a semi-insulating film 17. The semi-insulating film 17 may be, for example, semi-insulating Silicon Nitride (sinSiN). The terminal electrode 11, the p-type terminal well layer 12, and the n⁺-type channel stopper layer 13 are electrically connected to each other via a contact hole formed in the interlayer insulating film 14 provided on the first main surface of the termination region. Further, in the termination region, a terminal protective film 18 is provided so as to cover the surface electrode 1, the terminal electrode 11, and the semi-insulating film 17. The terminal protective film 18 may be made of, for example, polyimide.

As shown in FIG. 2, in the RC-IGBT 90, the p⁺-type collector layer 9 is provided on the upper layer portion of the second main surface of the semiconductor substrate SB in the IGBT region, and the n⁺-type cathode layer 10 is provided on the upper layer portion of the second main surface of the semiconductor substrate SB in the diode region.

Further, in the gate wiring region and the termination region, in order to suppress the operation of a parasitic pn junction diode having the p⁺-type contact layer 4 formed on the first main surface side of the semiconductor substrate SB as the anode, the p⁺-type collector layer 9 is provided on the upper layer portion of the second main surface as in the IGBT region.

In general, RC-IGBT is required to have an IGBT current cutoff capability (Reverse Bias Safe Operating Area: RBSOA), and diode is required to have Reverse Recovery Safe Operation Area: RRSOA).

Here, when a p-type semiconductor layer such as the p⁺-type collector layer 9 is formed on the second main surface of the termination region, the carrier injection efficiency for the diode is almost zero, but the carrier injection efficiency for the IGBT increases and RBSOA decreases. The decrease in RBSOA becomes more pronounced as the thickness of the semiconductor substrate SB increases, because the effect of diffusion of carriers in the lateral direction (planar direction) increases as the thickness of the semiconductor substrate SB increases. That is, the decrease in RBSOA becomes more remarkable as the withstand voltage class increases.

Therefore, a good metal contact property is desired for the p-type semiconductor layer such as the p⁺-type collector layer 9 in the IGBT region and the n⁺-type cathode layer 10 in the diode region. On the contrary, for the p-type semiconductor layer in the termination region, a low metal contact property is desired in order to reduce carrier injection efficiency for the IGBT.

However, as shown in FIG. 2, since the back electrode 20 is continuously and integrally formed from the IGBT region and the diode region to the termination region, it is difficult to change the metal contact properties between the p⁺-type collector layer 9 in the IGBT region and the p⁺-type collector layer 9 in the termination region. Therefore, the metal contact property suitable for one of them will be selected.

Figure 3:
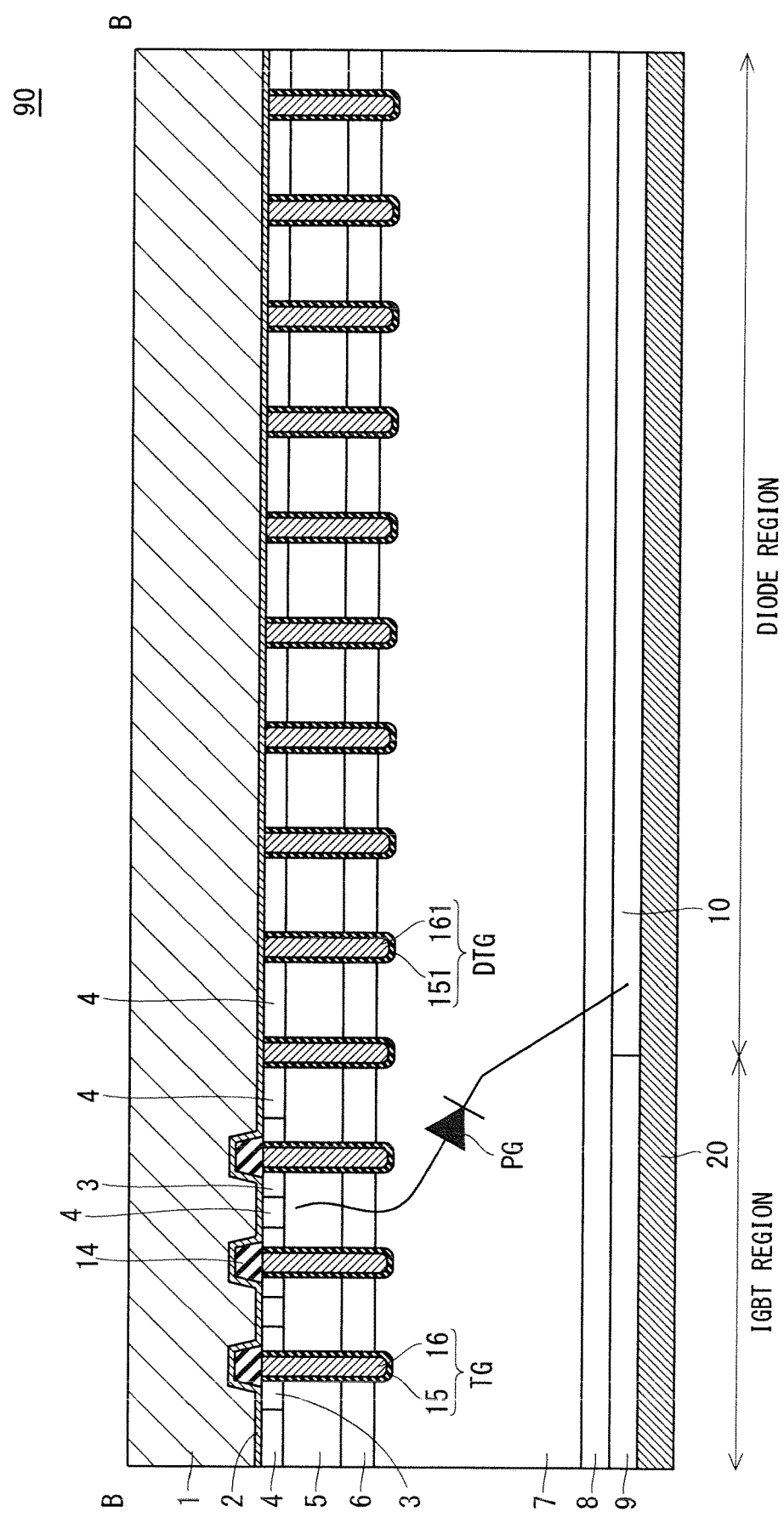
FIG. 3 is a cross-sectional view showing an example of a configuration of an RC-IGBT.

Here, FIG. 3 shows a cross section in the direction indicated by the arrow along line B-B shown in FIG. 1. FIG. 3 is a cross-sectional view of a boundary portion between the diode region and the IGBT region. As shown in FIG. 3, at the end of the IGBT region in the boundary portion between the diode region and the IGBT region, there is a region where the n⁺-type source layer 3 and the p⁺-type contact layer 4 are mixed as in the other IGBT region. The p⁺-type contact layer 4 (including the p-type base layer 5) contributes as an anode layer, and forms a parasitic pn junction diode PD with the n$^+$-type cathode layer 10, which reduces the recovery loss in the diode region. As a method for suppressing the operation of the parasitic pn junction diode PD, there is a method of extending the p$^+$-type collector layer 9 in the IGBT region toward the diode region, but there is a problem that the diode region cannot be effectively utilized.

First Preferred Embodiment

<Device Configuration>

Figure 4:
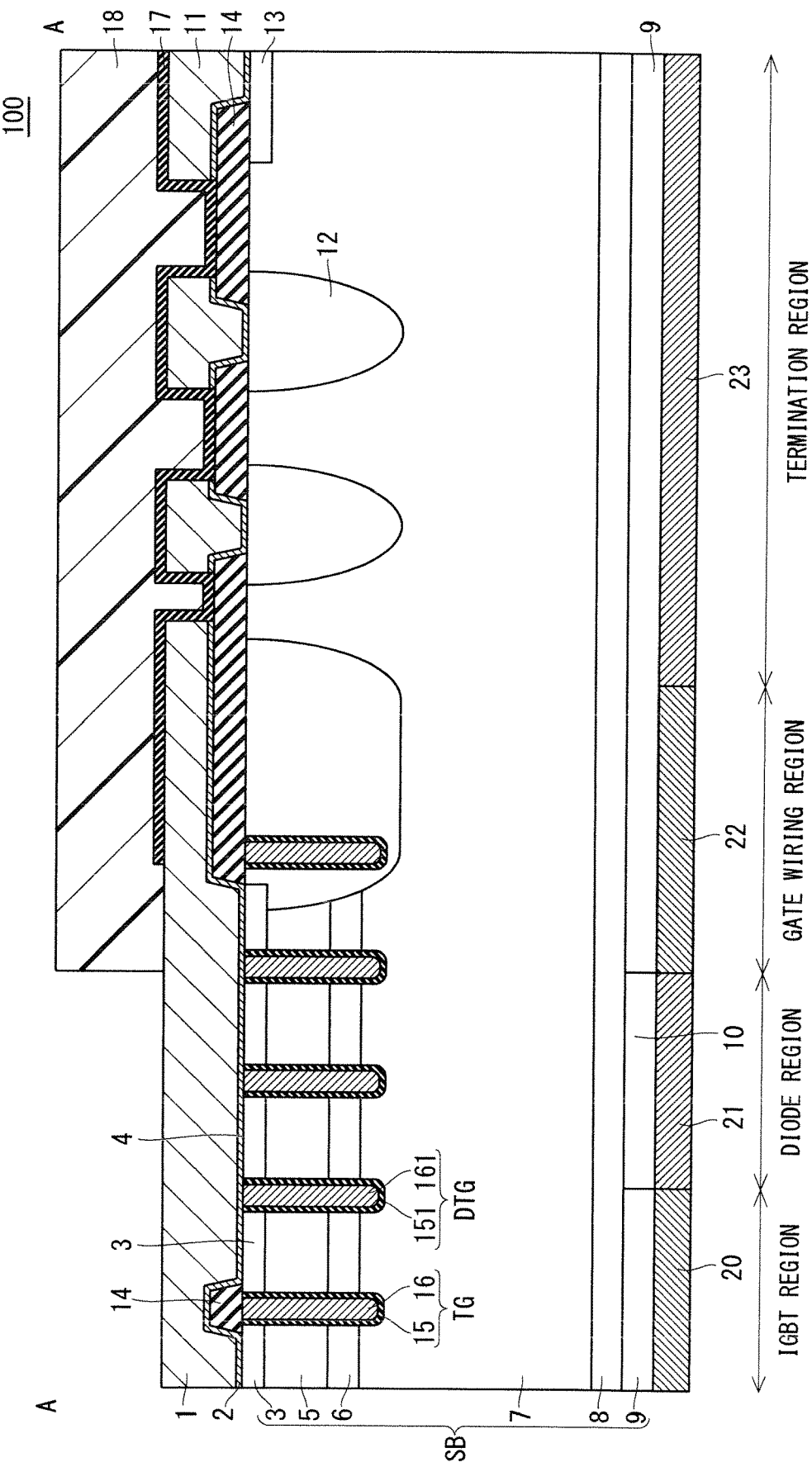
FIG. 4 is a cross-sectional view showing a configuration of an RC-IGBT of a first preferred embodiment.

Hereinafter, an RC-IGBT 100 according to the first preferred embodiment will be described. A plan view of the RC-IGBT 100 is the same as that of FIG. 1. FIG. 4 shows a cross section in a direction indicated by the arrow along line A-A shown in FIG. 1 as a cross-sectional view of the RC-IGBT 100. In FIG. 4, the same components as those of the RC-IGBT 90 described with reference to FIG. 2 are denoted by the same reference numerals, and duplicate description will be omitted. As shown in FIG. 4, the RC-IGBT 100 differs from the RC-IGBT 90 shown in FIG. 2 in that a different back electrode is provided for each region on the second main surface of the semiconductor substrate SB.

That is, a back electrode 20 (first electrode) is provided in the IGBT region, a back electrode 21 (second electrode) is provided in the diode region, a back electrode 22 (third back electrode) is provided in the gate wiring region, and a back electrode 23 (fourth back electrode) is provided in the termination region.

The back electrode 20 is an electrode ohmic-connected to the p$^+$-type collector layer 9 in the IGBT region, and the back electrode 21 is an electrode ohmic-connected to the n$^+$-type cathode layer 10 in the diode region.

The materials of the back electrodes 20 and 21 are selected to achieve the desired carrier injection efficiencies in the respective region. That is, for the back electrode 20 in the IGBT region and the back electrode 21 in the diode region, materials that are to be ohmic-connected to the p$^+$-type collector layer 9 and the n$^+$-type cathode layer 10 are selected respectively, in order to reduce a loss due to the contact resistance.

The back electrode 20 is made of, for example, Al, AlSi, Ni, TiSi$_2$, PtSi$_2$, PtSi, Mo (molybdenum), or the like, as a material to be ohmic-connected to the p-type semiconductor layer and Schottky-connected to the n-type semiconductor layer.

The back electrode 21 is made of, for example, Ti, MoSi$_2$, or the like, as a material to be Schottky-connected to the p-type semiconductor layer and ohmic-connected to the n-type semiconductor layer.

The back electrode 22 is an electrode connected to the p$^+$-type collector layer 9 in the gate wiring region, and the back electrode 23 is an electrode connected to the p$^+$-type collector layer 9 in the termination region.

As the materials of the back electrodes 22 and 23, a material to be Schottky-connected is selected in order to reduce the carrier injection efficiencies from the back surface of the region where each of them is provided.

The back electrodes 21 and 22 are made of, for example, Ti, MoSi$_2$, or the like, as a material to be Schottky-connected to the p$^+$-type collector layer 9.

In this way, by providing different back electrodes according to the regions on the second main surface of the semiconductor substrate SB, the RC-IGBT 100 is able to suppress operation of the parasitic pn junction diode and to suppress an increase in the conduction loss of the IGBT and the diode, and to improve the current cutoff capability (RBSOA) of the IGBT and the current cutoff capability (RRSOA) of the diode.

<Manufacturing Method>

Next, a method of manufacturing the RC-IGBT 100 will be described with reference to FIGS. 5 to 14 that are cross-sectional views showing the manufacturing process in order.

Figure 5:
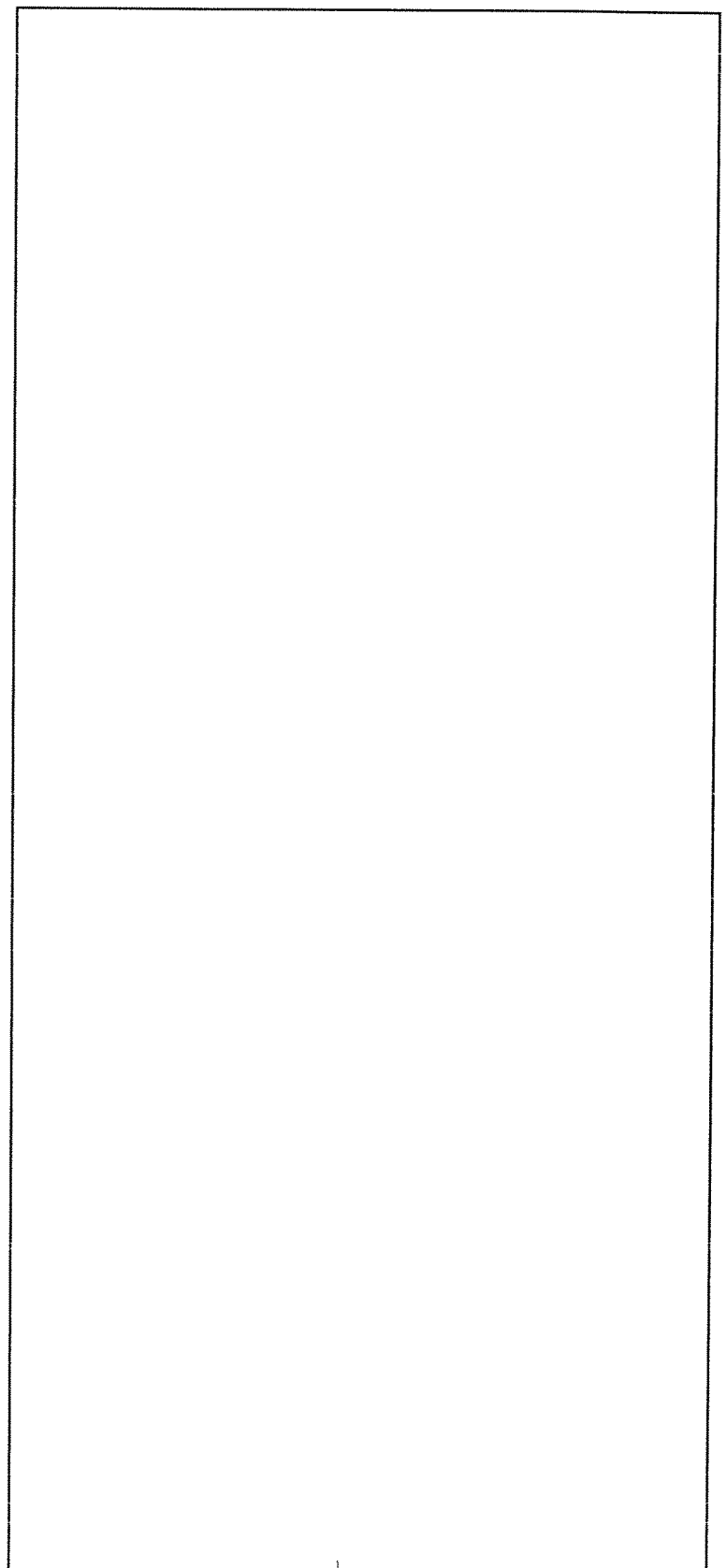
FIGS. 5 to 14 are cross-sectional views each showing a manufacturing process of the RC-IGBT of the first preferred embodiment.

First, as shown in FIG. 5, the semiconductor substrate BS constituting the n$^-$-type drift layer 7 is prepared. For the semiconductor substrate BS, for example, a so-called Floating Zone (FZ) wafer manufactured by the FZ method or a so-called Magnetic field applied Czochralski (MCZ) wafer manufactured by the MCZ method may be used. It may be an n-type wafer containing n-type impurities.

As the semiconductor substrate BS, for example, an n-type wafer having a specific resistance ($\rho$) of 250 $\Omega \cdot$cm and a thickness of 725 μm is used. In FIG. 5, the entire semiconductor substrate BS is an n$^-$-type drift layer 7. However, from the first main surface side or the second main surface side of such a semiconductor substrate BS, p-type or n-type impurity ions are injected, and then they are diffused into the semiconductor substrate BS by heat treatment or the like, whereby a p-type or n-type semiconductor layer is formed to obtain a configuration on the first main surface side of the RC-IGBT 100.

Figure 6:
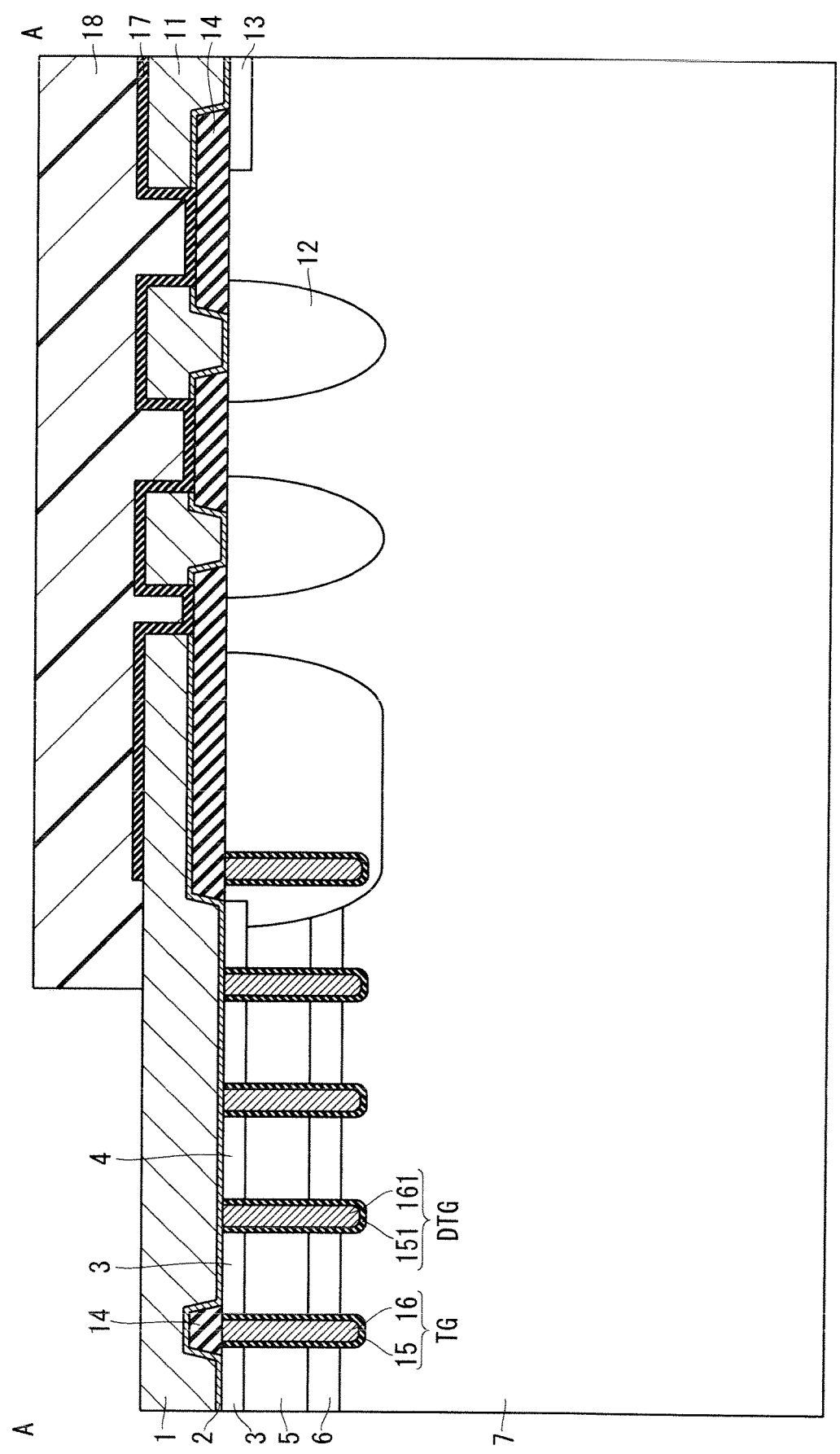

FIG. 6 shows the semiconductor substrate BS in a state where on the first main surface side of the semiconductor substrate BS, semiconductor layers of IGBT, diode, gate wiring, and the termination region, electrodes, insulating films, a trench gate, a dummy trench gate, and the like are formed with use of a publicly-known manufacturing method.

Figure 7:
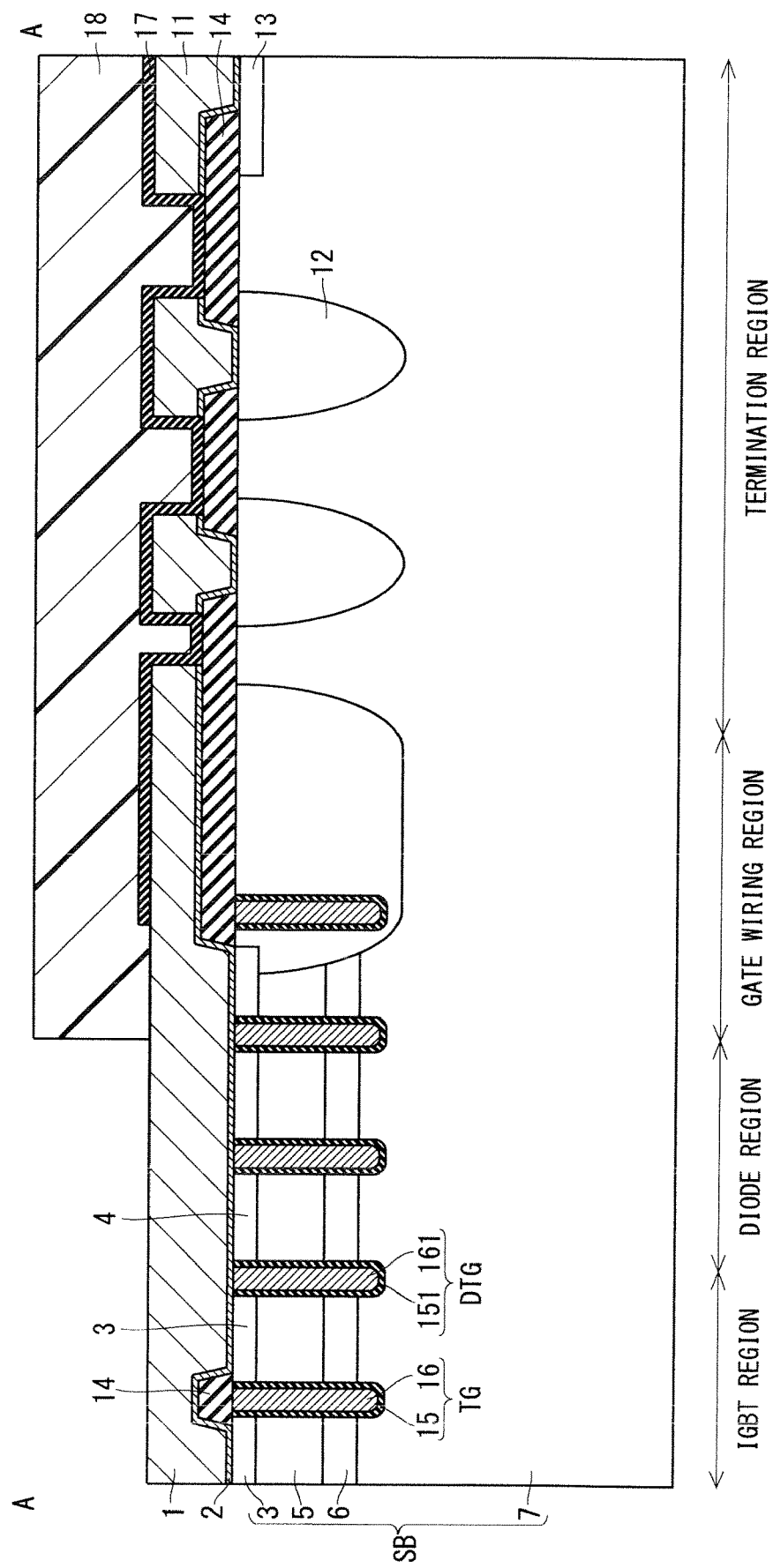

Next, in the step shown in FIG. 7, the semiconductor substrate BS is thinned to have a thickness of, for example, 300 μm by polishing and wet etching.

Figure 8:
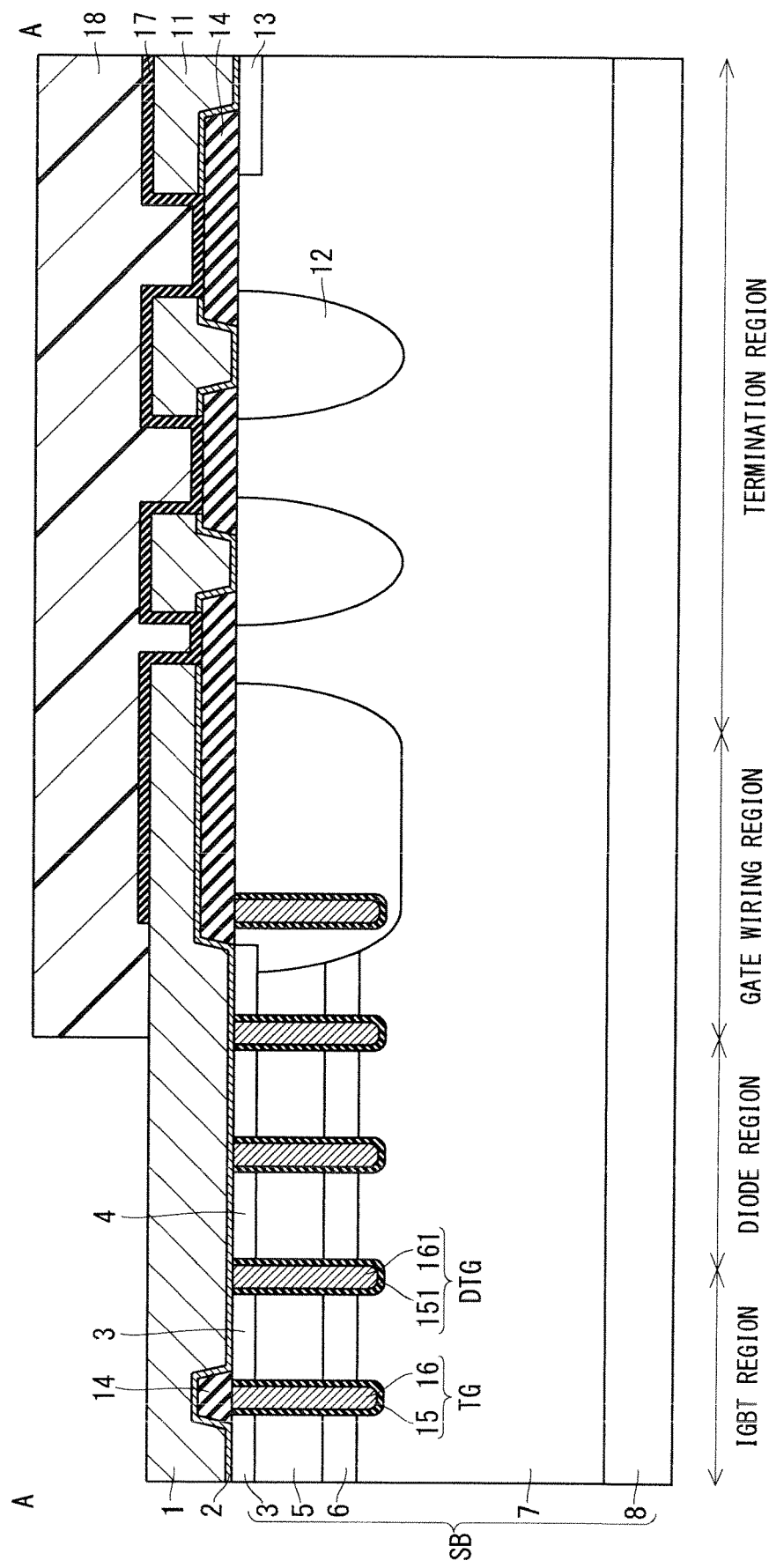

Next, in the step shown in FIG. 8, n-type impurities are ion-implanted from the second main surface side of the n$^-$-type drift layer 7 to form the n-type buffer layer 8. The n-type buffer layer 8 may be formed by injecting phosphorus (P) ions, for example. It may also be formed by injecting protons (H$^+$). Further, it may also be formed by injecting both protons and phosphorus. Then, the second main surface is irradiated with a laser beam and is laser annealed to activate phosphorus or protons.

Figure 9:
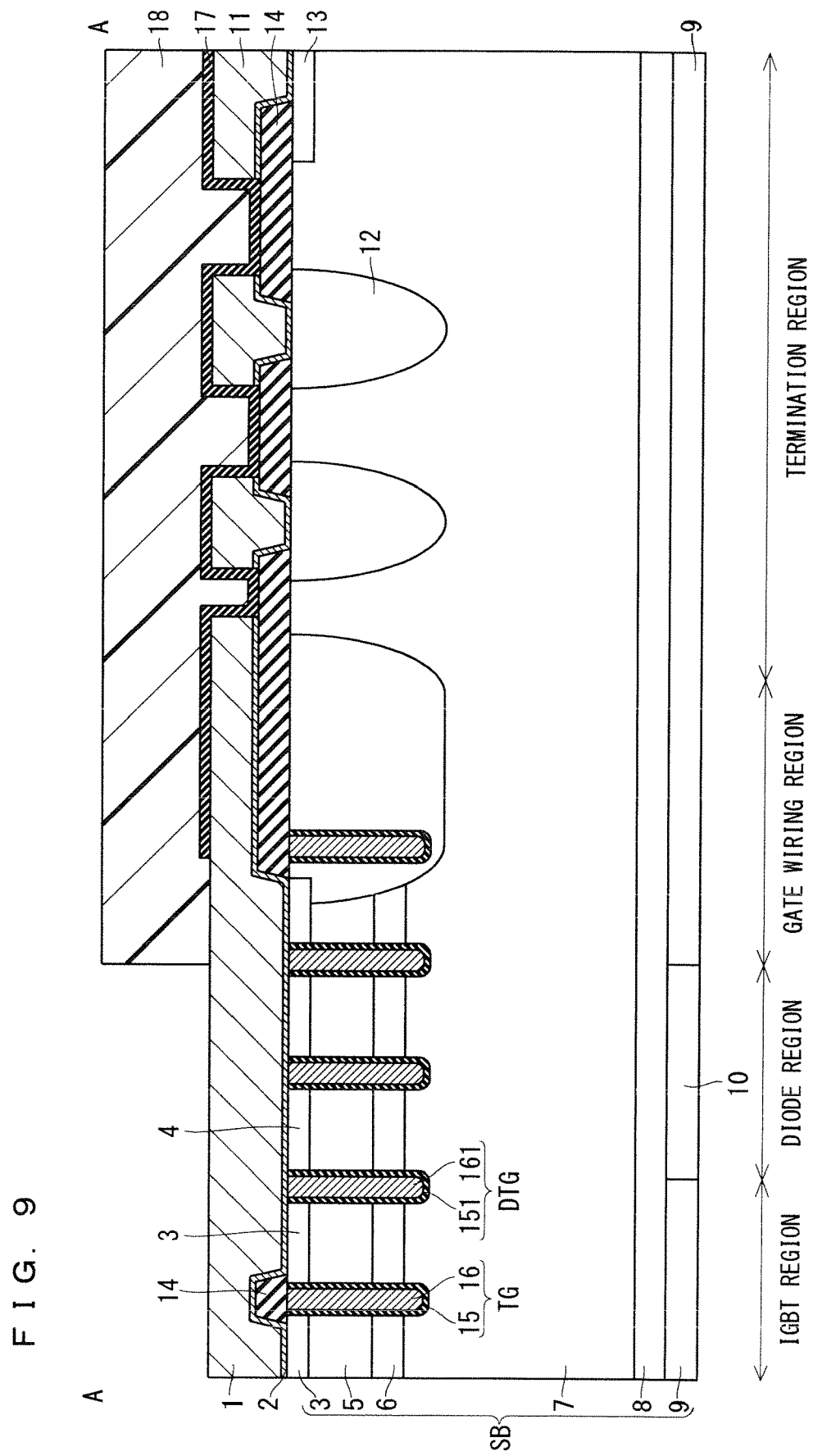

Next, in the step shown in FIG. 9, a resist pattern (not shown) is formed on the second main surface of the n$^-$-type drift layer 7 by photolithography processing, and p-type impurities are ion-implanted through the resist pattern to form the p$^+$-type collector layer 9. The p$^+$-type collector layer 9 may be formed by injecting boron (B), for example. The p$^+$-type collector layer 9 is also formed in the termination region.

After that, the resist pattern is removed, a resist pattern (not shown) is formed in the same manner by photolithography processing, and n-type impurities are ion-implanted through the resist pattern to form the n$^+$-type cathode layer 10. The n$^+$-type cathode layer 10 may be formed by injecting phosphorus (P), for example.

After the resist pattern is removed, the second main surface is irradiated with a laser beam and is laser annealed to activate boron and phosphorus.

Figure 10:
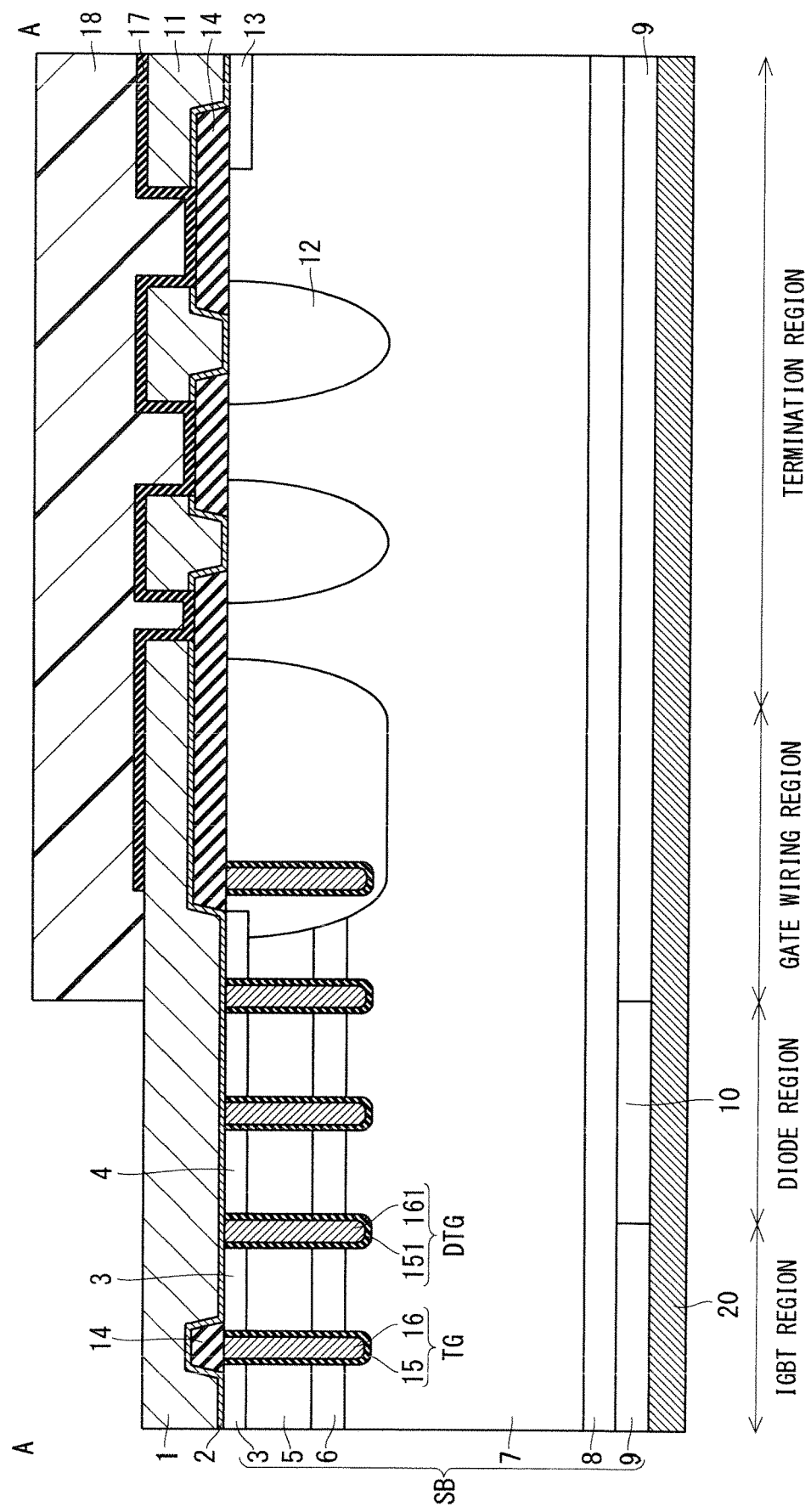

Next, in the step shown in FIG. 10, for example, the back electrode 20 of AlSi is formed by sputtering or the like on the second main surface of the n$^-$-type drift layer 7 on which the p$^+$-type collector layer 9 and the n$^+$-type cathode layer 10 are formed.

Figure 11:
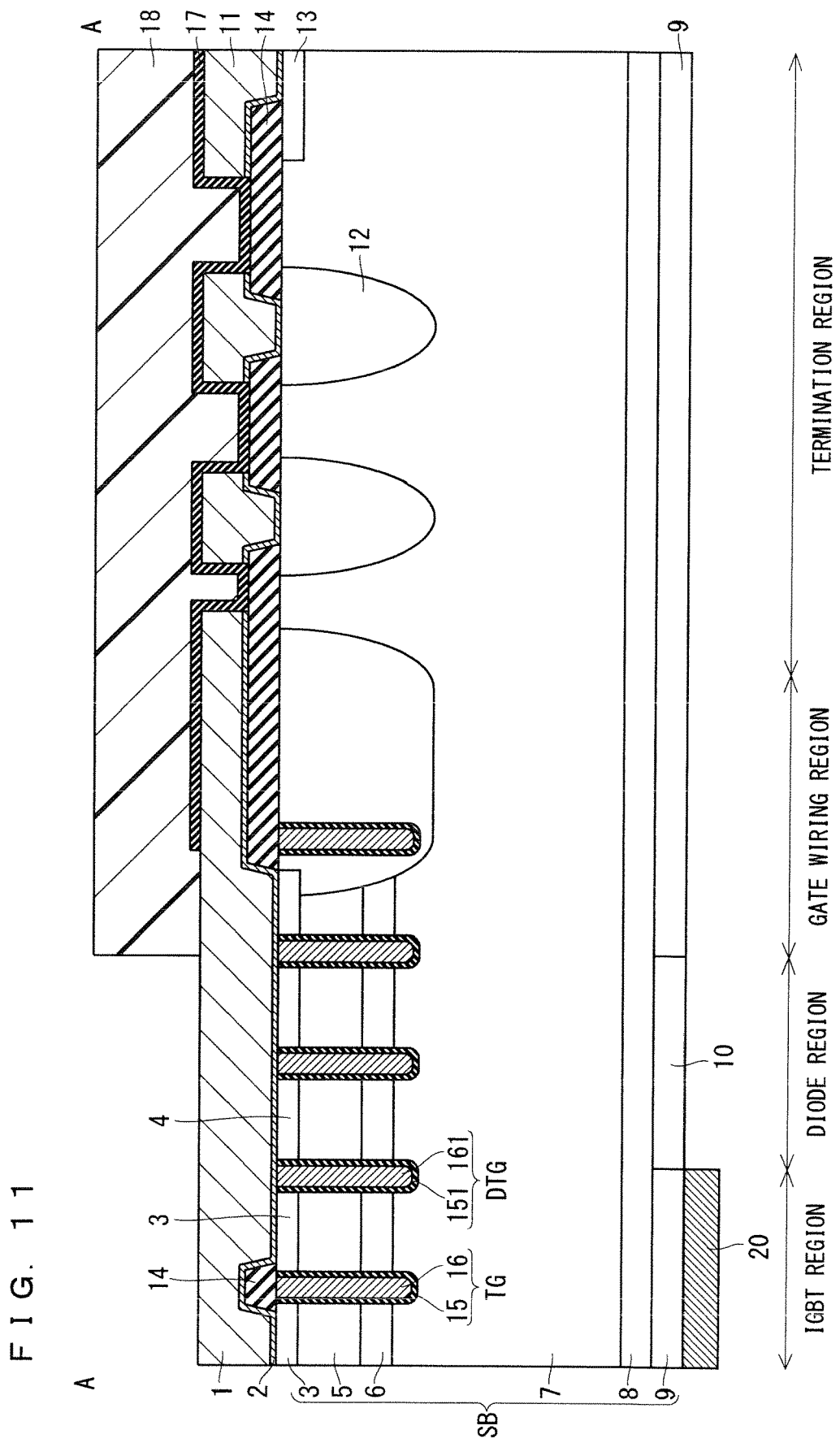

Next, a resist pattern (not shown) in which the resist remains only in the IGBT region on the back electrode 20 is formed by photolithography processing, and then the back electrode 20 in a region other than the IGBT region is removed by, for example, dry etching. Thereby, as shown in FIG. 11, a configuration in which the back electrode 20 is formed on the p$^+$-type collector layer 9 in the IGBT region is obtained.

Figure 12:
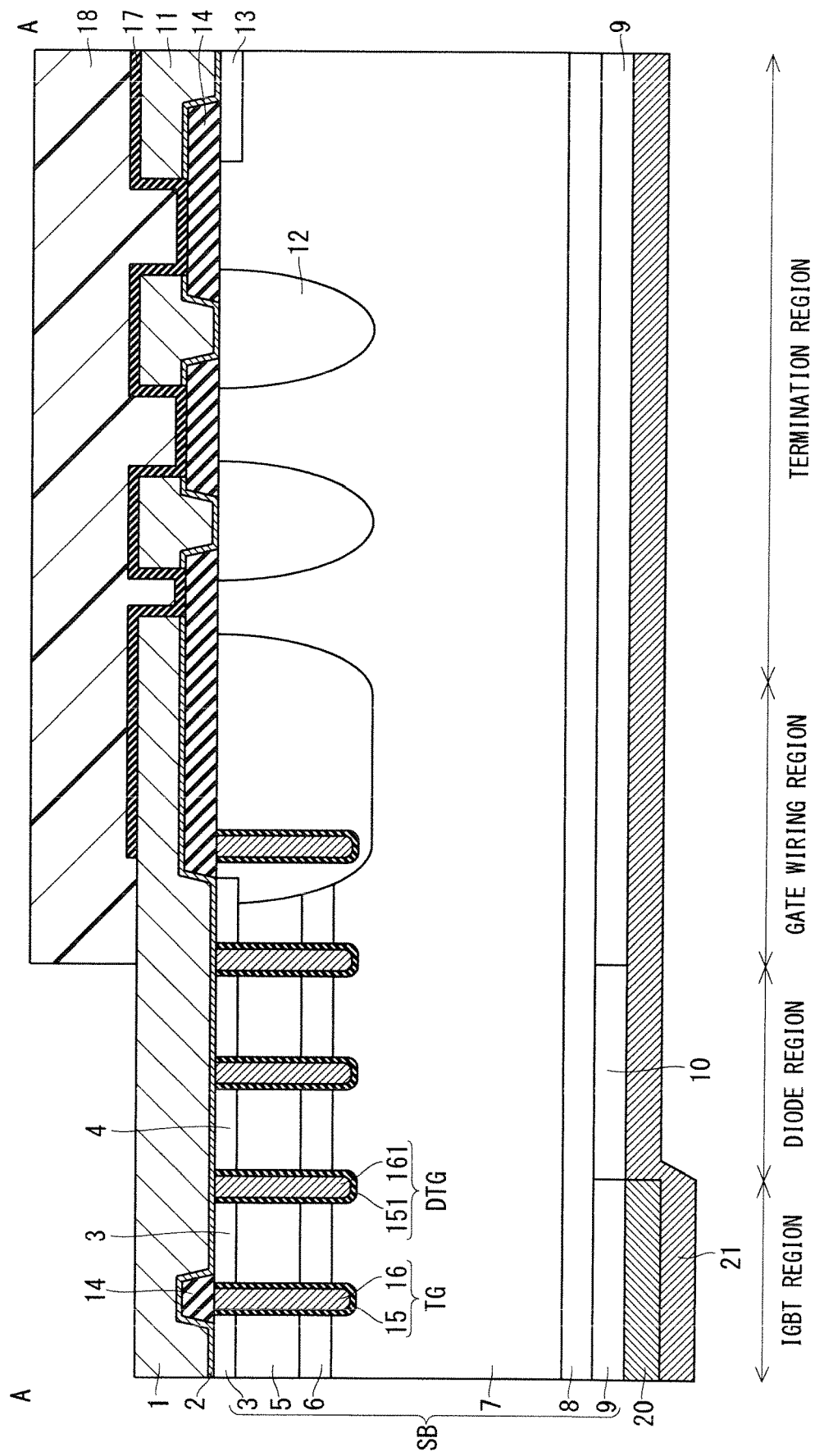

Next, in the step shown in FIG. 12, for example, the back electrode 21 of Ti is formed by sputtering or the like on the second main surface of the n$^-$-type drift layer 7 in a state where the back electrode 20 is formed in the IGBT region.

Figure 13:
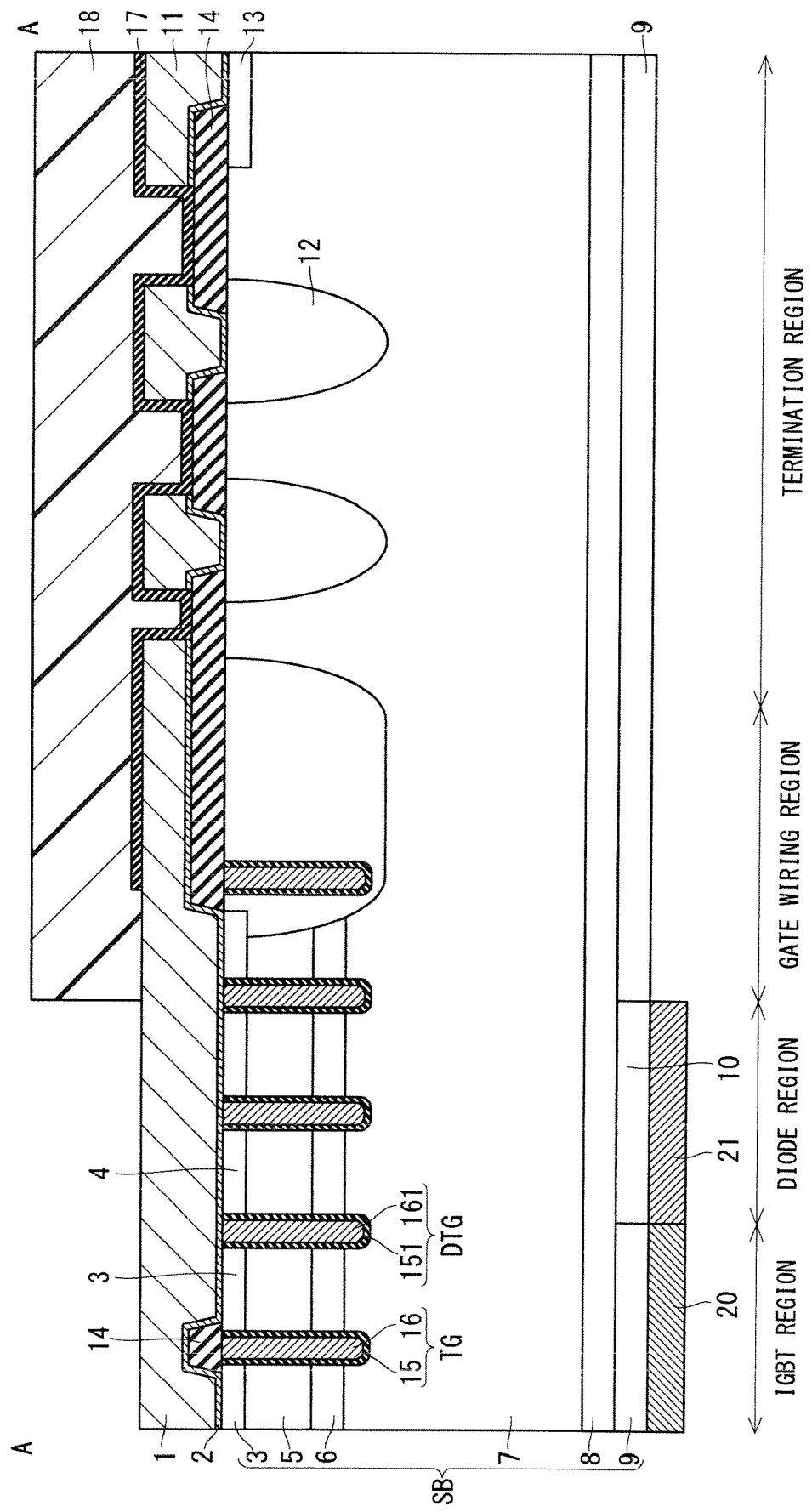

Next, after a resist pattern (not shown) in which the resist only remains in the diode region on the back electrode 21 is formed by photolithography processing, the back electrode 21 in a region other than the diode region is removed by, for example, dry etching. Thereby, as shown in FIG. 13, a configuration in which the back electrode 21 is formed on the n$^+$-type cathode layer 10 in the diode region is obtained.

Next, on the second main surface of the n$^-$-type drift layer 7 in a state where the back electrode 20 is formed in the IGBT region and the back electrode 21 is formed in the diode region, the back electrode 22 of Ti, for example, is formed by sputtering or the like.

Figure 14:
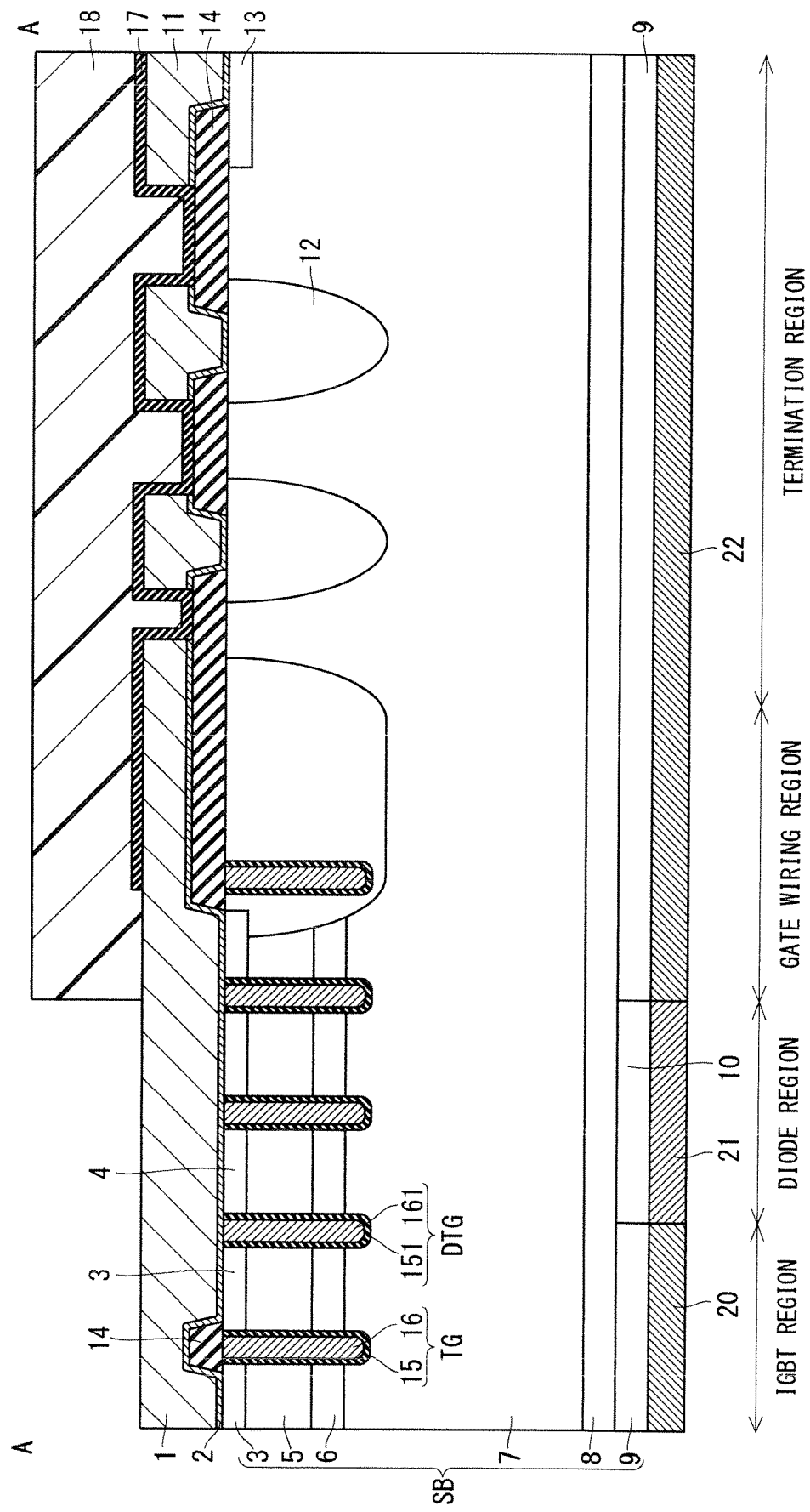

Next, after a resist pattern (not shown) in which the resist remains only in the gate wiring region and the termination region is formed on the back electrode 21 by the photolithography processing, the back electrode 22 in the gate wiring region and the termination region is removed by, for example, dry etching. Thereby, as shown in FIG. 14, a configuration in which the back electrode 22 is formed on the p$^+$-type collector layer 9 in the gate wiring region and the termination region is obtained.

Next, on the second main surface of the n$^-$-type drift layer 7 in which the back electrode 20 is formed in the IGBT region, the back electrode 21 is formed in the diode region, and the back electrode 22 is formed in the gate wiring region and the termination region, for example, the back electrode 23 of Ti is formed by sputtering or the like.

Next, after a resist pattern (not shown) in which the resist remains only in the termination region is formed on the back electrode 23 by the photolithography processing, the back electrode 23 in the IGBT region, the diode region, and the gate wiring region is removed by, for example, dry etching, whereby the RC-IGBT 100 shown in FIG. 4 is obtained.

According to the manufacturing method described above, the back electrode 20 and the p$^+$-type collector layer 9 are ohmic-connected to each other, and the metal contact property is good. Further, the back electrode 21 and the n$^+$-type cathode layer 10 are ohmic-connected to each other, and the metal contact property is good. On the other hand, the back electrodes 22 and 23 and the p$^+$-type collector layer 9 are Schottky-connected, and the metal contact property is low.

It is possible to improve the metal contact property of the back electrode in the IGBT region and the diode region, and suppress an increase in the on-resistance (energization loss) of the IGBT and the diode. On the other hand, in the gate wiring region and the termination region, since the metal contact property is lowered, it is possible to suppress carrier (hole) injection from the back surface during the IGBT operation and improve the current cutoff capability.

<Modification>

In the above description, the back electrode 22 and the back electrode 23 are made of Ti, but the present back electrodes are not limited to Ti. The back electrode 22 may be made of MoSi$_2$ and the back electrode 23 may be made of Ti, or vice versa.

Further, in the case where the back electrode 22 and the back electrode 23 are made of Ti, if they are formed at the same time as the back electrode 21, the number of manufacturing steps can be reduced and an increase in the manufacturing cost can be suppressed.

Figure 15:
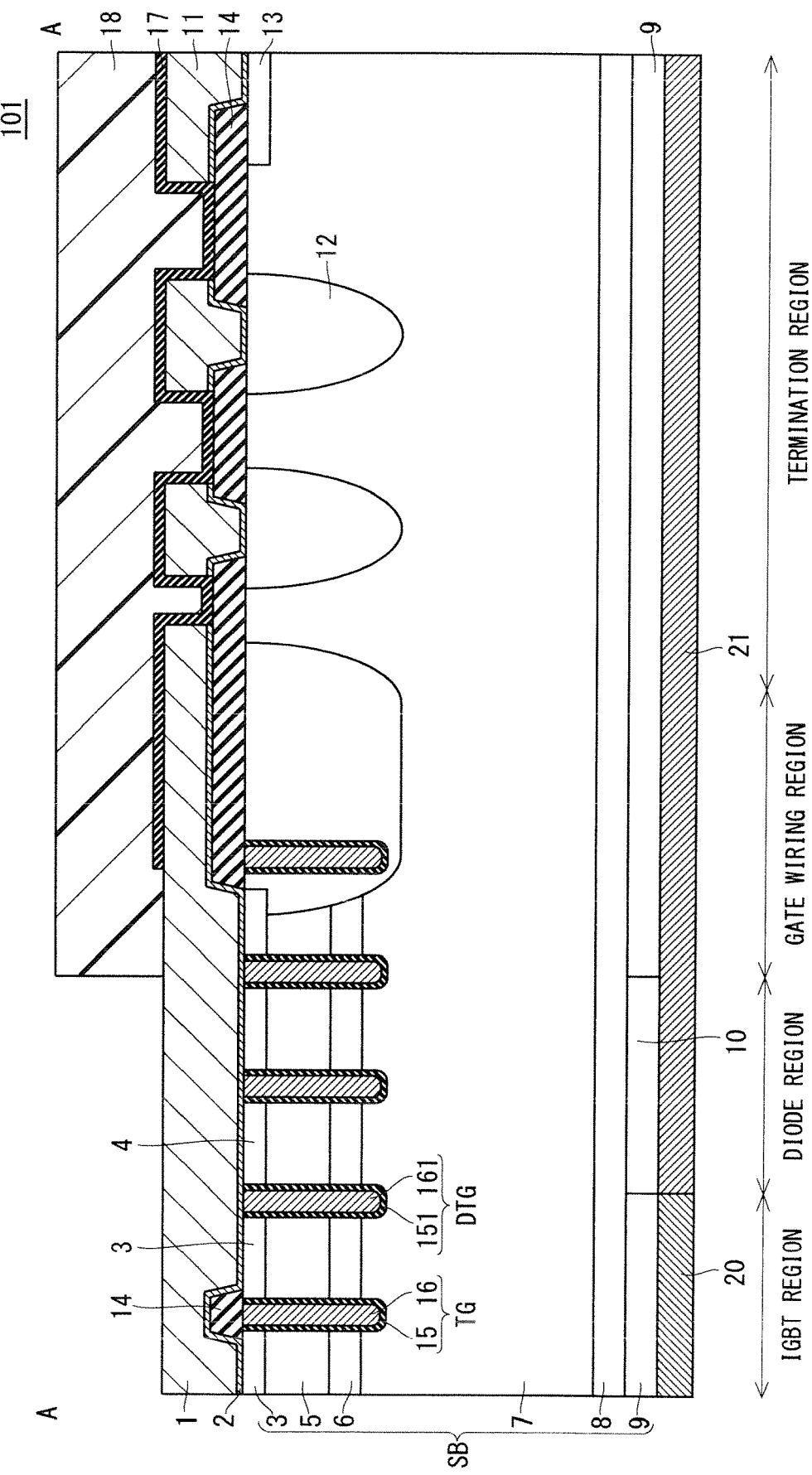
FIG. 15 is a cross-sectional view showing a configuration of a modification of the RC-IGBT of the first preferred embodiment.

FIG. 15 shows a configuration of an RC-IGBT 101 in which the back electrode 21 shared by the diode region, the gate wiring region, and the termination region is formed.

Second Preferred Embodiment

Figure 16:
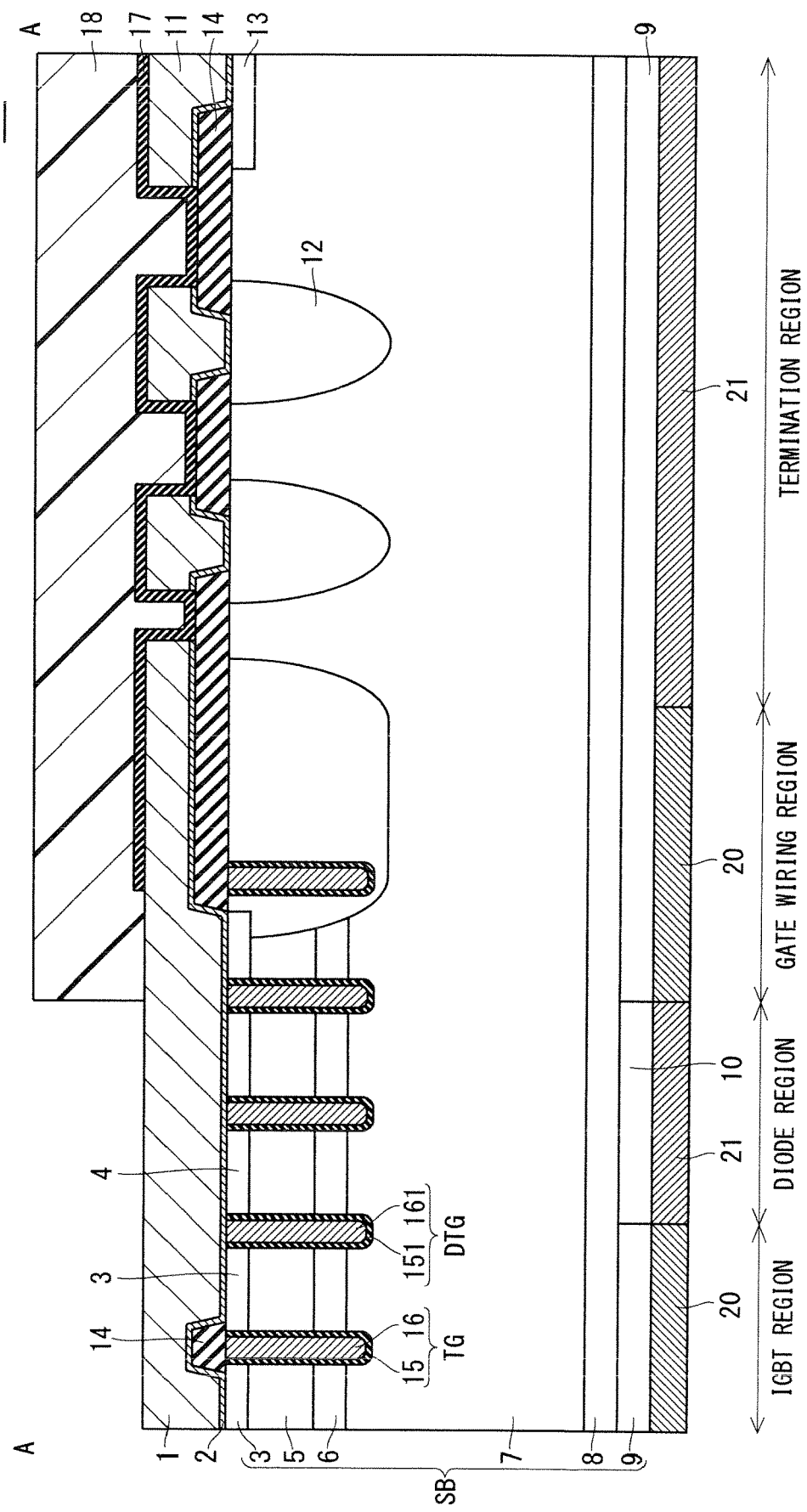
FIG. 16 is a cross-sectional view showing a configuration of an RC-IGBT of a second preferred embodiment.

Hereinafter, an RC-IGBT 200 according to a second preferred embodiment will be described. A plan view of the RC-IGBT 200 is the same as that of FIG. 1. FIG. 16 shows a cross section in a direction indicated by the arrow along line A-A shown in FIG. 1 as a cross-sectional view of the RC-IGBT 200. Note that in FIG. 16, the same components as those of the RC-IGBT 90 described with reference to FIG. 2 are denoted by the same reference numerals, and duplicate description will be omitted.

As shown in FIG. 16, the RC-IGBT 200 has a configuration in which the back electrode 20 is formed in the gate wiring region as in the IGBT region, and the back electrode 21 is formed in the termination region. In the termination region, the back electrode 21 and the p$^+$-type collector layer 9 are Schottky-connected to each other, and the metal contact property is low. However, in the gate wiring region, the back electrode 20 and the p$^+$-type collector layer 9 are ohmic-connected to each other, and the metal contact property is good. Therefore, the carrier injection efficiency for the IGBT region adjacent to the gate wiring region is higher than that of the RC-IGBT 100 of the first preferred embodiment, the carrier injection amount is larger, and the on voltage of the IGBT can be lowered.

As described above, the back electrode 20 is made of, for example, Al, AlSi, Ni, TiSi$_2$, PtSi$_2$, PtSi, Mo (molybdenum) or the like, as a material to be ohmic-connected to the p-type semiconductor layer and Schottky-connected to the n-type semiconductor layer.

The back electrode 21 is made of, for example, Ti, MoSi$_2$, or the like, as a material to be Schottky-connected to the p-type semiconductor layer and ohmic-connected to the n-type semiconductor layer.

Third Preferred Embodiment

Figure 17:
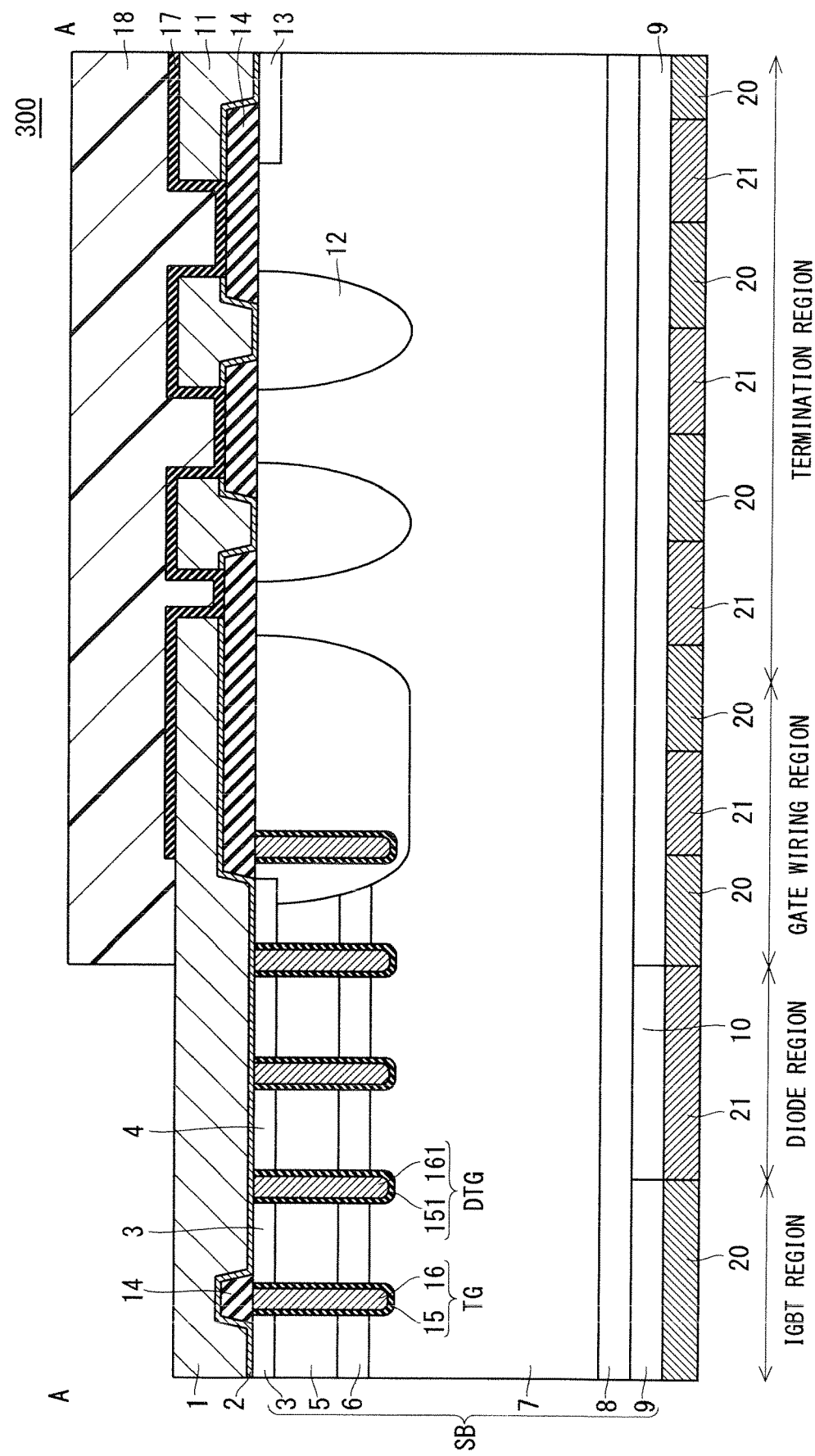
FIG. 17 is a cross-sectional view showing a configuration of an RC-IGBT of a third preferred embodiment.

Hereinafter, an RC-IGBT 300 according to a third preferred embodiment will be described. A plan view of the RC-IGBT 300 is the same as that of FIG. 1. FIG. 17 shows a cross section in a direction indicated by the arrow along line A-A shown in FIG. 1 as a cross-sectional view of the RC-IGBT 300. In FIG. 17, the same components as those of RC-IGBT 90 described with reference to FIG. 2 are denoted by the same reference numerals, and duplicate description will be omitted.

As shown in FIG. 17, the RC-IGBT 300 has a configuration in which a plurality of back electrodes 20 and a plurality of back electrodes 21 are alternately arranged in a region where the gate wiring region and the termination region are combined.

By adjusting the area ratio in a plan view of the plurality of back electrodes 20 and the plurality of back electrodes 21 in the region where the gate wiring region and the termination region are combined, it is possible to widely and freely adjust the carrier injection efficiency in the gate wiring region and the termination region, compared with the RC-IGBT 100 of the first preferred embodiment. By adjusting the carrier injection efficiency on the back surface, it is possible to control the trade-off between the on-voltage rise of the IGBT and the current cutoff capability. The area ratio may be appropriately determined according to the rating of the RC-IGBT.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

Although FIG. 17 shows a configuration in which the plurality of back electrodes 20 and the plurality of back electrodes 21 are alternately arranged in a region where the gate wiring region and the termination region are combined, it is possible to have a configuration in which the plurality of back electrodes 20 and the plurality of back electrodes 21 may be alternately arranged on only one of the gate wiring region or the termination region, and in the other region, only the back electrodes 20 or only the back electrodes 21 may be arranged.

Fourth Preferred Embodiment

Figure 18:
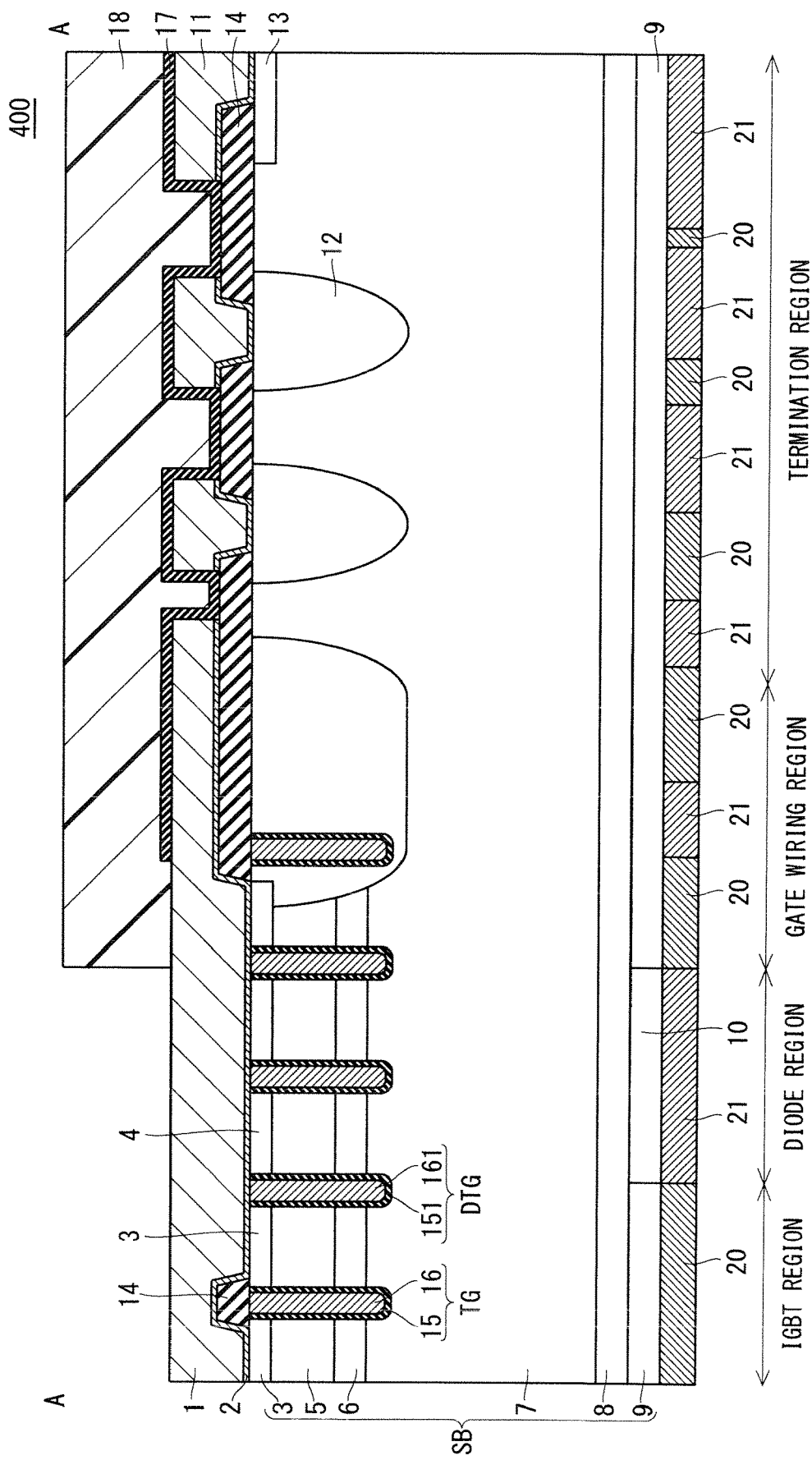
FIG. 18 is a cross-sectional view showing a configuration of an RC-IGBT of a fourth preferred embodiment.

Hereinafter, an RC-IGBT 400 according to a fourth preferred embodiment will be described. A plan view of the RC-IGBT 400 is the same as that of FIG. 1. FIG. 18 shows a cross section in a direction indicated by the arrow along line A-A shown in FIG. 1 as a cross-sectional view of the RC-IGBT 400. In FIG. 18, the same components as those of RC-IGBT 90 described with reference to FIG. 2 are denoted by the same reference numerals, and duplicate description will be omitted.

As shown in FIG. 18, the RC-IGBT 400 has a configuration in which a plurality of back electrodes 20 and a plurality of back electrodes 21 are alternately arranged in a region where the gate wiring region and the termination region are combined. This point is the same as the RC-IGBT 300 of the third preferred embodiment. However, it is configured that the area ratio of the back electrode 20 to the back electrode 21 in a plan view, that is, a value calculated by dividing the area of the back electrode 20 by the area of the back electrode 21, gradually decreases from the active region including the IGBT region and the diode region toward the chip end. The degree of change in the area ratio may be appropriately determined according to the rating of the RC-IGBT.

In the example of FIG. 18, the back electrode 20 is arranged adjacent to the diode region, the back electrode 21 is arranged next thereto, and thereafter, the back electrode 20 and the back electrode 21 are arranged alternately such that the back electrode 20 gradually decreases in area while the back electrode 21 gradually increases in area. The portion where the back electrode 20 is arranged is ohmic-connected to the $p^+$-type collector layer 9, and the metal contact property is good. Therefore, the carrier injection efficiency is high, whereby the on voltage of the IGBT can be lowered. On the other hand, the portion where the back electrode 21 is arranged is Schottky-connected to the $p^+$-type collector layer 9, and the metal contact property is low and the carrier injection efficiency is low. However, the back electrode 21 gradually increases as the distance from the active region increases. Therefore, since the carrier injection efficiency on the back surface gradually decreases as the distance from the active region increases, the current cutoff capability can be improved while an increase in the on voltage of the IGBT is suppressed.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

Although FIG. 18 shows a configuration in which the plurality of back electrodes 20 and the plurality of back electrodes 21 are alternately arranged in a region where the gate wiring region and the termination region are combined, it is possible to have a configuration in which the plurality of back electrodes 20 and the plurality of back electrodes 21 may be alternately arranged on only one of the gate wiring region and the termination region, and the area ratio of the back electrode 20 to the back electrode 21 gradually decreases toward the tip end.

Fifth Preferred Embodiment

Figure 19:
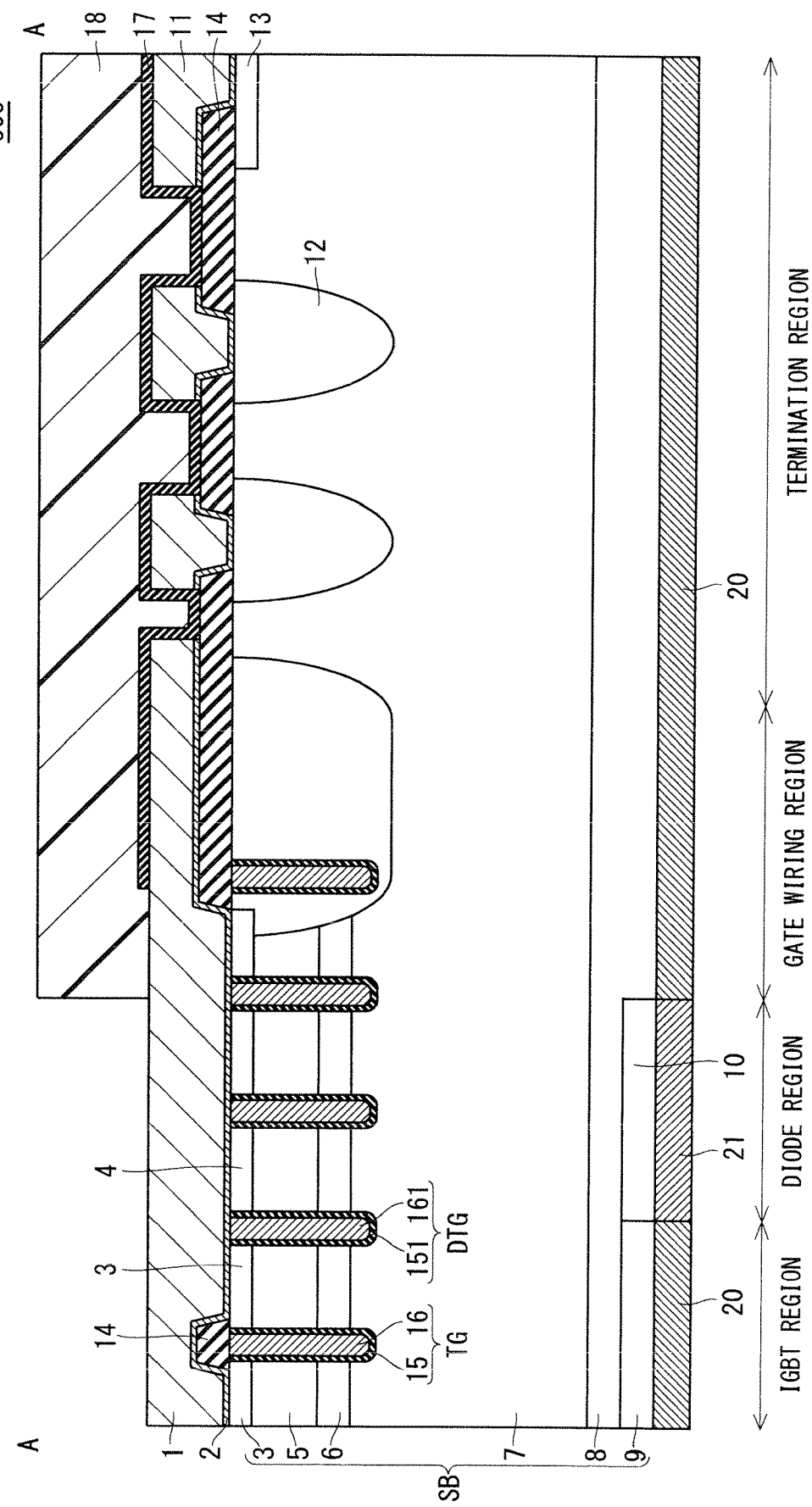
FIG. 19 is a cross-sectional view showing a configuration of an RC-IGBT of a fifth preferred embodiment.

Hereinafter, an RC-IGBT 500 according to a fifth preferred embodiment will be described. A plan view of the RC-IGBT 500 is the same as that of FIG. 1. FIG. 19 shows a cross section in a direction indicated by the arrow along line A-A shown in FIG. 1 as a cross-sectional view of the RC-IGBT 500. In FIG. 19, the same components as those of the RC-IGBT 90 described with reference to FIG. 2 are denoted by the same reference numerals, and duplicate description will be omitted.

As shown in FIG. 19, in the RC-IGBT 500, the $p^+$-type collector layer 9 is not provided in the gate wiring region and the termination region, and the n-type buffer layer 8 extends up to the second main surface of the semiconductor substrate SB. The back electrode 20 is connected to the n-type buffer layer 8 in the gate wiring region and the termination region. Since the back electrode 20 is made of a material to be Schottky-connected to the n-type semiconductor layer, the back electrode 20 and the n-type buffer layer 8 have a low metal contact property. Further, since the $p^+$-type collector layer 9 is not provided in the gate wiring region and the termination region, the carrier injection efficiency on the back surface is almost zero during operation of the IGBT, and the current cutoff capability of the IGBT can be further improved. Further, since the gate wiring region and the termination region have a low metal contact property, carrier injection efficiency can be lowered even during diode operation, and a decrease in current cutoff capability can be suppressed.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

Sixth Preferred Embodiment

Figure 20:
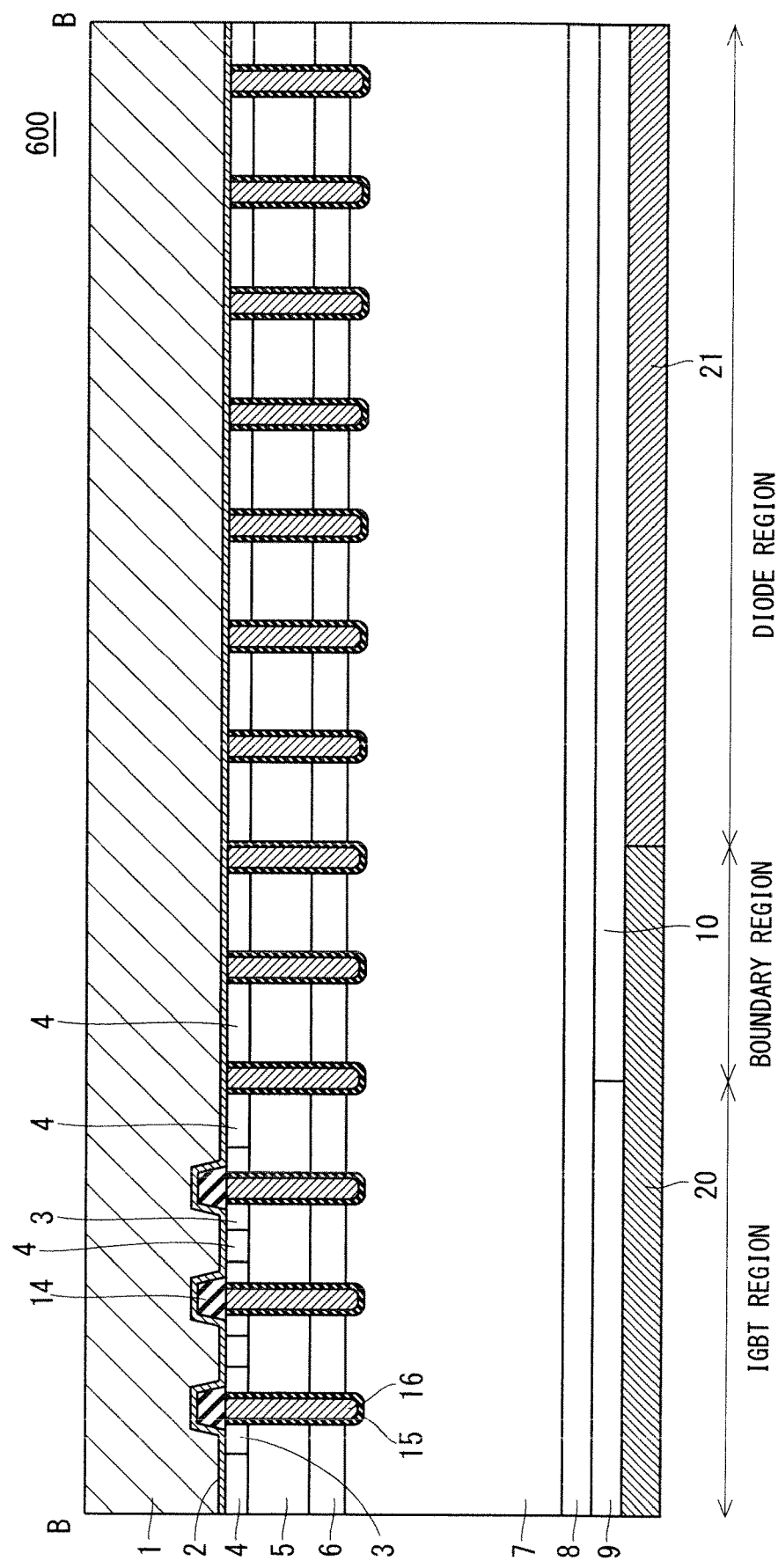
FIG. 20 is a cross-sectional view showing a configuration of an RC-IGBT of a sixth preferred embodiment.

Hereinafter, an RC-IGBT 600 according to a sixth preferred embodiment will be described. A plan view of the RC-IGBT 600 is the same as that of FIG. 1. FIG. 20 shows a cross section in a direction indicated by the arrow along line B-B shown in FIG. 1 as a cross-sectional view of the RC-IGBT 600. In FIG. 20, the same components as those of RC-IGBT 90 described with reference to FIG. 3 are denoted by the same reference numerals, and duplicate description will be omitted.

As shown in FIG. 20, in the RC-IGBT 600, a boundary region is provided between the IGBT region and the diode region. The configuration on the first main surface side of the semiconductor substrate SB in the boundary region is the same as that in the diode region, and the $n^+$-type cathode layer 10 that is the same as that in the diode region is provided on the second main surface. On the other hand, in the IGBT region and the boundary region, the back electrode 20 is arranged, and in the diode region, the back electrode 21 is arranged.

Here, the back electrode 20 is made of, for example, AlSi, and has a good metal contact property with the $p^+$-type collector layer 9 in the IGBT region, but has a Schottky connection with the $n^+$-type cathode layer 10 in the boundary region, so that the metal contact property is low. On the other hand, the back electrode 21 is made of, for example, Ti, has an ohmic connection with the $n^+$-type cathode layer 10, and has a good metal contact property.

As described above, since the metal contact property between the $n^+$-type cathode layer 10 in the boundary region and the back electrode 20 is low, the carrier injection efficiency from the $n^+$-type cathode layer 10 in the parasitic pn junction diode generated with the $n^+$-type cathode layer 10, with the $p^+$-type contact layer 4 in the region where the $n^+$-type source layer 3 and the $p^+$-type contact layer 4 are mixed at the end of the IGBT region adjacent to the diode region being used as the anode layer, decreases. Therefore, the operation of the parasitic pn junction diode can be suppressed.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

In the RC-IGBT 600 shown in FIG. 20, only the cross section in the arrow direction along line B-B shown in FIG. 1 is shown. However, the configuration of the cross section in the arrow direction along line A-A shown in FIG. 1 may be any of the configurations of the RC-IGBT 100 shown in FIG. 4, RC-IGBT 101 shown in FIG. 15, and RC-IGBTs 200 to 500 shown in FIGS. 16 to 19.

Seventh Preferred Embodiment

Figure 21:
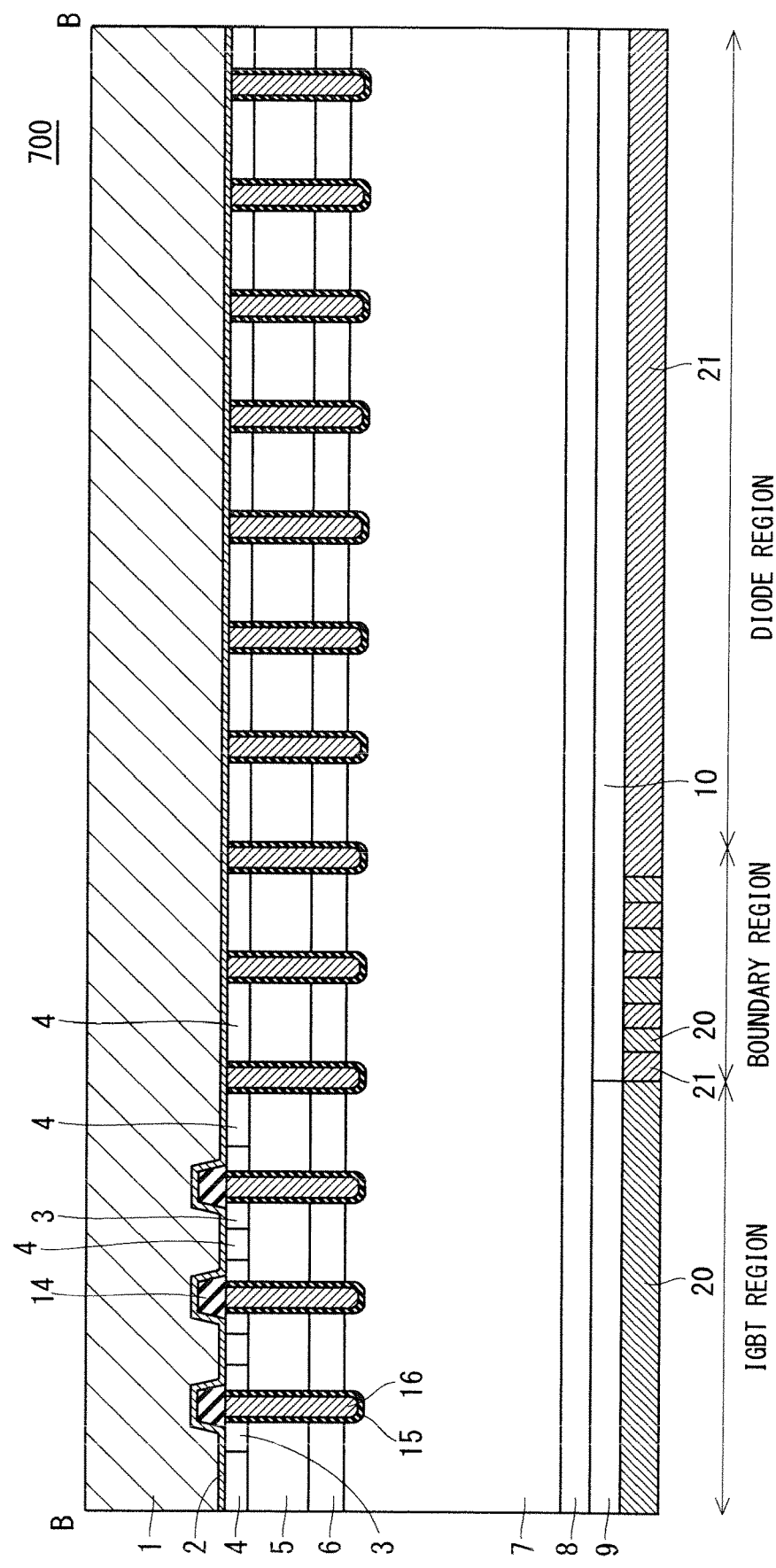
FIG. 21 is a cross-sectional view showing a configuration of an RC-IGBT of a seventh preferred embodiment.

Hereinafter, an RC-IGBT 700 according to a seventh preferred embodiment will be described. A plan view of the RC-IGBT 700 is the same as that of FIG. 1. FIG. 21 shows a cross section in a direction shown by the arrow along line B-B shown in FIG. 1 as a cross-sectional view of the RC-IGBT 700. In FIG. 21, the same components as those of RC-IGBT 90 described with reference to FIG. 3 are denoted by the same reference numerals, and duplicate description will be omitted.

As shown in FIG. 21, in the RC-IGBT 700, a boundary region is provided between the IGBT region and the diode region. The configuration on the first main surface side of the semiconductor substrate SB in the boundary region is the same as that in the diode region, and the $n^+$-type cathode layer 10 that is the same as that in the diode region is provided on the second main surface. The back electrode 20 is arranged in the IGBT region, and the back electrode 21 is arranged in the diode region, but the boundary region has a configuration in which a plurality of back electrodes 20 and a plurality of back electrodes 21 are alternately arranged.

With adjustment of the area ratio of the plurality of back electrodes 20 and the plurality of back electrodes 21 in the boundary region in a plan view, the carrier injection efficiency in the boundary region can be widely and freely adjusted as compared with that of the RC-IGBT 600 of the sixth preferred embodiment. This contributes to the diode operation in the boundary region and facilitates suppression of the operation of the parasitic pn junction diode. The area ratio may be appropriately determined according to the rating of the RC-IGBT.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

In the RC-IGBT 700 shown in FIG. 21, only the cross section in the arrow direction along line B-B shown in FIG. 1 is shown. However, the configuration of the cross section in the arrow direction along line A-A shown in FIG. 1 may be any of the configurations of the RC-IGBT 100 shown in FIG. 4, RC-IGBT 101 shown in FIG. 15, and RC-IGBTs 200 to 500 shown in FIGS. 16 to 19.

Eighth Preferred Embodiment

Figure 22:
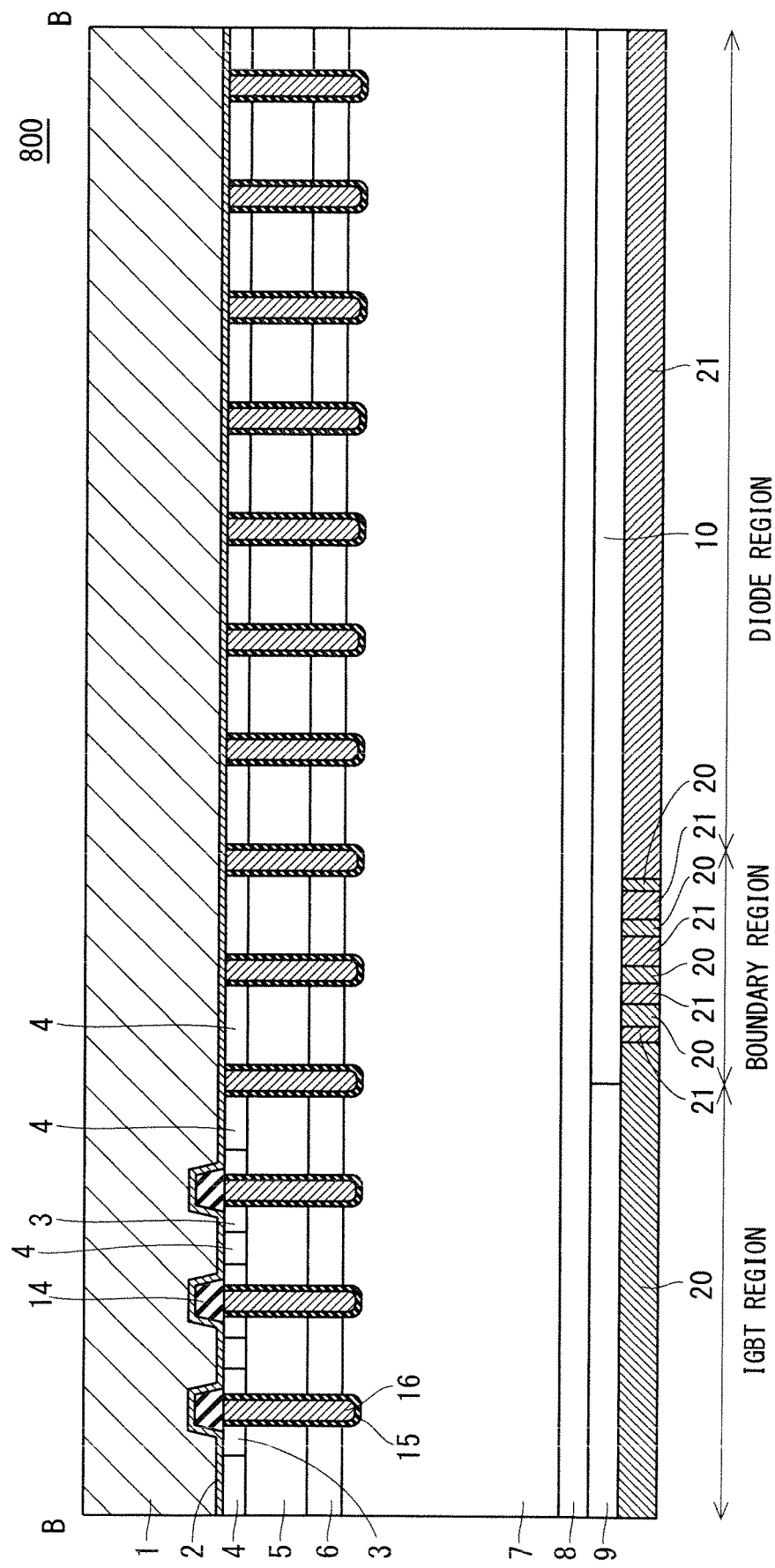
FIG. 22 is a cross-sectional view showing a configuration of an RC-IGBT of an eighth preferred embodiment.

Hereinafter, an RC-IGBT 800 according to an eighth preferred embodiment will be described. A plan view of the RC-IGBT 800 is the same as that of FIG. 1. FIG. 22 shows a cross section in a direction shown by the arrow along line B-B shown in FIG. 1 as a cross-sectional view of the RC-IGBT 800. In FIG. 22, the same components as those of RC-IGBT 90 described with reference to FIG. 3 are denoted by the same reference numerals, and duplicate description will be omitted.

As shown in FIG. 22, the RC-IGBT 800 has a configuration in which a boundary region is provided between the IGBT region and the diode region, and a plurality of back electrodes 20 and a plurality of back electrodes 21 are alternately arranged in the boundary region. This point is the same as the RC-IGBT 700 of the seventh preferred embodiment. However, it is configured that the area ratio of the back electrode 20 to the back electrode 21 in a plan view, that is, the value calculated by dividing the area of the back electrode 20 by the area of the back electrode 21, gradually decreases from the IGBT region toward the diode region. The degree of change in the area ratio may be appropriately determined according to the rating of the RC-IGBT.

In the example of FIG. 22, the back electrode 20 is arranged adjacent to the IGBT region, the back electrode 21 is arranged next thereto, and thereafter, the back electrode 20 and the back electrode 21 are arranged alternately such that the back electrode 20 decreases in area while the back electrode 21 increases in area. The portion where the back electrode 20 is arranged has a Schottky connection with the $n^+$-type cathode layer 10, and the metal contact property is low and the carrier injection efficiency is low, but the back electrode 21 gradually increases as the distance from the cathode region increases. Therefore, since the carrier injection efficiency on the back surface gradually increases as the distance from the cathode region increases, operation of the parasitic pn junction diode can be suppressed while an increase in the on voltage of the diode is suppressed.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

In the RC-IGBT 800 shown in FIG. 22, only the cross section in the arrow direction along line B-B shown in FIG. 1 is shown. However, the configuration of the cross section in the arrow direction along line A-A shown in FIG. 1 may be any of the configurations of the RC-IGBT 100 shown in FIG. 4, RC-IGBT 101 shown in FIG. 15, and RC-IGBTs 200 to 500 shown in FIGS. 16 to 19.

Ninth Preferred Embodiment

Figure 23:
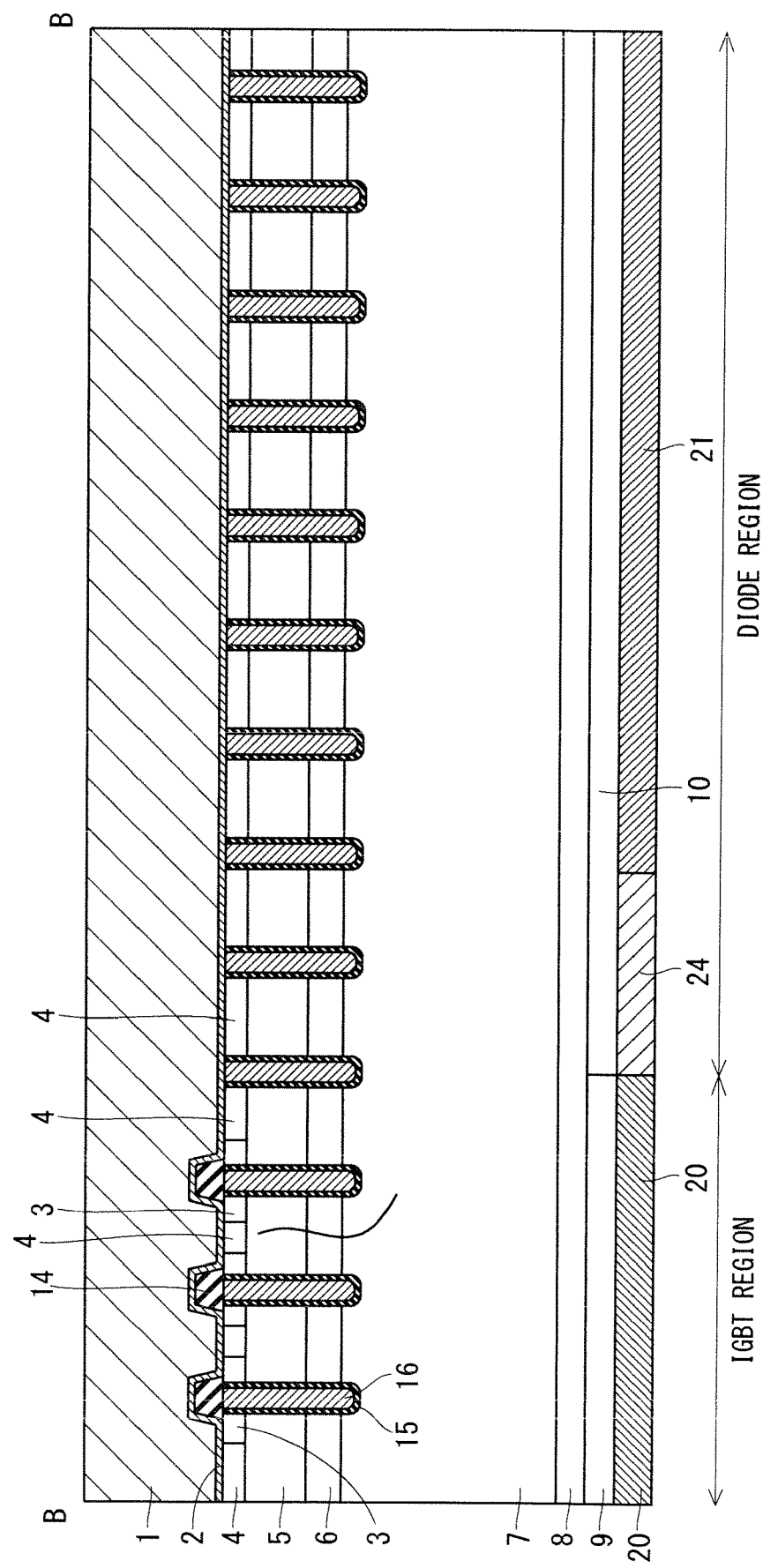
FIG. 23 is a cross-sectional view showing a configuration of an RC-IGBT of a ninth preferred embodiment.

Hereinafter, an RC-IGBT 900 according to a ninth preferred embodiment will be described. A plan view of the RC-IGBT 900 is the same as that of FIG. 1. FIG. 23 shows a cross section in a direction indicated by the arrow along line B-B shown in FIG. 1 as a cross-sectional view of the RC-IGBT 900. In FIG. 23, the same components as those of RC-IGBT 90 described with reference to FIG. 3 are denoted by the same reference numerals, and duplicate description will be omitted.

As shown in FIG. 23, the RC-IGBT 900 has a configuration in which a boundary region is provided between the IGBT region and the diode region, and a back electrode 24 (third electrode) is arranged in the boundary region.

The back electrode 24 is made of a material different from those of the back electrodes 20 and 21, that is, nickel silicide (NiSi, $NiSi_2$) for example. Since the back electrode 24 is made of a material different from those of the back electrodes 20 and 21, carrier injection efficiency in the boundary region can be adjusted more widely and freely. This contributes to diode operation in the boundary region, and it becomes easier to suppress operation of parasitic pn junction diodes.

As described above, the back electrode 20 is made of, for example, Al, AlSi, Ni, $TiSi_2$, $PtSi_2$, PtSi, Mo (molybdenum) or the like, as a material to be ohmic-connected to the p-type semiconductor layer and Schottky-connected to the n-type semiconductor layer.

The back electrode 21 is made of, for example, Ti, $MoSi_2$, or the like, as a material to be Schottky-connected to the p-type semiconductor layer and ohmic-connected to the n-type semiconductor layer.

In the RC-IGBT 900 shown in FIG. 23, only the cross section in the arrow direction along line B-B shown in FIG. 1 is shown. However, the configuration of the cross section in the arrow direction along line A-A shown in FIG. 1 may be any of the configurations of the RC-IGBT 100 shown in FIG. 4, RC-IGBT 101 shown in FIG. 15, and RC-IGBTs 200 to 500 shown in FIGS. 16 to 19.

Other Application Examples

In the above-described first to ninth preferred embodiments, a trench gate type RC-IGBT has been taken as an example, but the art of the present disclosure may be applied to a planar gate type RC-IGBT as well. To the configuration of the first main surface side (front surface side) of a planar gate type RC-IGBT, a general configuration may be applied, and as for the configuration of the electrodes on the second main surface side (rear surface side), the configuration described in the first to ninth preferred embodiments may be used.

In the present disclosure, the respective preferred embodiments can be freely combined or appropriately modified or omitted within the scope of the present disclosure.

While the disclosure has been shown and described in detail, the foregoing description is in all aspects illustrative and not restrictive. It is therefore understood that numerous modifications and variations can be devised.

What is claimed is:

1. A semiconductor device in which a transistor and a diode are formed on a common semiconductor substrate, wherein
    the semiconductor substrate includes:
        a transistor region in which the transistor is formed; and
        a diode region in which the diode is formed,
    the transistor region includes:
        a first semiconductor layer of a first conductive type provided on a second main surface side of the semiconductor substrate;
        a second semiconductor layer of a second conductive type provided on the first semiconductor layer;
        a third semiconductor layer of the first conductive type provided on a first main surface side of the semiconductor substrate with respect to the second semiconductor layer;
        a fourth semiconductor layer of the second conductive type provided on the third semiconductor layer;
        a gate insulating film formed in contact with the fourth semiconductor layer, the third semiconductor layer, and the second semiconductor layer;
        a gate electrode formed so as to face the third semiconductor layer via the gate insulating film;
        an electrode connected to the fourth semiconductor layer; and
        at least one first electrode connected to the first semiconductor layer,
    the diode region includes:
        a fifth semiconductor layer of the second conductive type provided on the second main surface side of the semiconductor substrate;
        the second semiconductor layer provided on the fifth semiconductor layer;
        the third semiconductor layer;
        a sixth semiconductor layer of the first conductive type provided on the third semiconductor layer;
        the electrode connected to the sixth semiconductor layer; and
        at least one second electrode connected to the fifth semiconductor layer, and
    the at least one first electrode and the at least one second electrode are made of different materials.

2. The semiconductor device according to claim 1, wherein
    the first semiconductor layer and the at least one first electrode are ohmic-connected to each other, and
    the fifth semiconductor layer and the at least one second electrode are ohmic-connected to each other.

3. The semiconductor device according to claim 2, wherein the semiconductor substrate includes a termination region provided outside an active region including the transistor region and the diode region, the termination region includes:
the first semiconductor layer provided on the second main surface side of the semiconductor substrate; and
the at least one second electrode connected to the first semiconductor layer, and
the first semiconductor layer and the at least one second electrode are Schottky-connected to each other.

4. The semiconductor device according to claim 3, wherein
the semiconductor substrate include a gate wiring region in which a gate wiring is provided along an outer periphery of the active region,
the gate wiring region includes:
the first semiconductor layer provided on the second main surface side of the semiconductor substrate; and
the at least one second electrode connected to the first semiconductor layer, and
the first semiconductor layer and the at least one second electrode are Schottky-connected to each other.

5. The semiconductor device according to claim 3, wherein
the semiconductor substrate includes a gate wiring region in which a gate wiring is provided along an outer periphery of the active region, and
the gate wiring region includes:
the first semiconductor layer provided on the second main surface side of the semiconductor substrate; and
the at least one first electrode connected to the first semiconductor layer.

6. The semiconductor device according to claim 5, wherein the first semiconductor layer and the at least one first electrode are ohmic-connected to each other.

7. The semiconductor device according to claim 2, wherein
the semiconductor substrate includes:
a termination region provided outside an active region including the transistor region and the diode region; and
a gate wiring region in which a gate wiring is provided along an outer periphery of the active region,
the gate wiring region and the termination region include the first semiconductor layer provided on the second main surface side of the semiconductor substrate,
at least one of the gate wiring region and the termination region includes the at least one first electrode and the at least one second electrode connected to the first semiconductor layer,
the first semiconductor layer and the at least one first electrode are ohmic-connected to each other, and
the first semiconductor layer and the at least one second electrode are Schottky-connected to each other.

8. The semiconductor device according to claim 7, wherein
a plurality of first electrodes and a plurality of second electrodes, connected to the first semiconductor layer, are arranged alternately, and an area ratio of the plurality of first electrodes to the plurality of second electrodes in a plan view gradually decreases from the active region toward an end of the semiconductor substrate.

9. The semiconductor device according to claim 2, wherein
the semiconductor substrate includes:
a termination region provided outside an active region including the transistor region and the diode region; and
a gate wiring region in which a gate wiring is provided along an outer periphery of the active region,
the gate wiring region and the termination region include:
the second semiconductor layer that reaches the second main surface side of the semiconductor substrate; and
the at least one first electrode connected to the second semiconductor layer, and
the second semiconductor layer and the at least one first electrode are Schottky-connected to each other.

10. The semiconductor device according to claim 2, wherein
a boundary region with the transistor region in the diode region includes the at least one first electrode connected to the fifth semiconductor layer in place of the at least one second electrode, and
the fifth semiconductor layer and the at least one first electrode are Schottky-connected to each other.

11. The semiconductor device according to claim 2, wherein
a boundary region with the transistor region in the diode region includes the at least one first electrode and the at least one second electrode connected to the fifth semiconductor layer in place of the at least one second electrode,
the fifth semiconductor layer and the at least one first electrode are Schottky-connected to each other, and
the fifth semiconductor layer and the at least one second electrode are ohmic-connected to each other.

12. The semiconductor device according to claim 11, wherein
a plurality of first electrodes and a plurality of second electrodes, connected to the fifth semiconductor layer, are alternately arranged, and an area ratio of the plurality of first electrodes to the plurality of second electrodes in a plan view gradually decreases from the transistor region toward the diode region.

13. The semiconductor device according to claim 2, wherein
a boundary region with the transistor region in the diode region includes a third electrode connected to the fifth semiconductor layer in place of the at least one second electrode, and
the third electrode is made of a material that is different from the materials of the at least one first electrode and the at least one second electrodes.

* * * * *